United States Patent
Josefsberg et al.

(10) Patent No.: US 9,660,655 B2
(45) Date of Patent: May 23, 2017

(54) ULTRA LOW PHASE NOISE FREQUENCY SYNTHESIZER

(71) Applicants: Yekutiel Josefsberg, Netanya (IL); Tal I. Lavian, Sunnyvale, CA (US)

(72) Inventors: Yekutiel Josefsberg, Netanya (IL); Tal I. Lavian, Sunnyvale, CA (US)

( * ) Notice: Subject to any disclaimer, the term of this patent is extended or adjusted under 35 U.S.C. 154(b) by 0 days.

(21) Appl. No.: 15/379,915

(22) Filed: Dec. 15, 2016

(65) Prior Publication Data

US 2017/0099057 A1 Apr. 6, 2017

Related U.S. Application Data

(63) Continuation of application No. 15/229,915, filed on Aug. 5, 2016.

(Continued)

(51) Int. Cl.
*H03L 7/08* (2006.01)
*H03L 7/07* (2006.01)
(Continued)

(52) U.S. Cl.
CPC ............... *H03L 7/07* (2013.01); *H03L 1/028* (2013.01); *H03L 7/20* (2013.01)

(58) Field of Classification Search
CPC . H03L 7/085; H03L 7/07; H03L 7/099; H03L 7/24
(Continued)

(56) References Cited

U.S. PATENT DOCUMENTS

| | | |
|---|---|---|
| 6,122,326 A | 9/2000 | Jackson et al. |
| 6,366,620 B1 | 4/2002 | Jackson et al. |

(Continued)

FOREIGN PATENT DOCUMENTS

WO 03026133 A1 3/2003

OTHER PUBLICATIONS

Gismero, J. et al., "9 GHz phase locked oscillator using a sampling phase detector. Application to VSAT local oscillators (18-27 GHz)," European Microwave Conference, 23rd IEEE, Oct. 1, 1993, pp. 784-786.
Liman, R. et al, "Noise in Sampling Phase Detectors for RF PLL," Proceedings of the 39th European Microwave Conference, Sep. 29-Oct. 1, 2009, Rome, Italy, pp. 480-483.
Partial PCT International Search dated Jan. 9, 2017 for PCT International Application No. PCT/IB2016/054790, 3 pages.

(Continued)

*Primary Examiner* — Dinh T Le
(74) *Attorney, Agent, or Firm* — Remarck Law Group PLC

(57) ABSTRACT

A system for providing ultra low phase noise frequency synthesizers using Fractional-N PLL (Phase Lock Loop), Sampling Reference PLL and DDS (Direct Digital Synthesizer). Modern day advanced communication systems comprise frequency synthesizers that provide a frequency output signal to other parts of the transmitter and receiver so as to enable the system to operate at the set frequency band. The performance of the frequency synthesizer determines the performance of the communication link. Current days advanced communication systems comprises single loop Frequency synthesizers which are not completely able to provide lower phase deviations for errors (For 256 QAM the practical phase deviation for no errors is 0.4-0.5°) which would enable users to receive high data rate. This proposed system overcomes deficiencies of current generation state of the art communication systems by providing much lower level of phase deviation error which would result in much higher modulation schemes and high data rate.

13 Claims, 22 Drawing Sheets

Related U.S. Application Data

(60) Provisional application No. 62/181,221, filed on Jun. 18, 2015.

(51) Int. Cl.
*H03L 7/20* (2006.01)
*H03L 1/02* (2006.01)

(58) Field of Classification Search
USPC .................................................. 327/147–159
See application file for complete search history.

(56) References Cited

U.S. PATENT DOCUMENTS

| | | | |
|---|---|---|---|
| 7,391,839 B2 * | 6/2008 | Thompson | H03L 7/16 327/156 |
| 7,545,224 B2 * | 6/2009 | Chow | H03L 7/10 331/16 |
| 7,656,236 B2 * | 2/2010 | Williams | H03L 7/087 331/1 R |
| 8,378,751 B2 | 2/2013 | Fagg | |
| 8,704,562 B2 | 4/2014 | Nicholls et al. | |
| 8,816,777 B2 * | 8/2014 | Szilagyi | H03L 7/08 327/156 |

OTHER PUBLICATIONS

Teng, K.H. et al., "Microwave Phase-Locked Loop Circuit Development and Efficiency Improvement," IEEE, High Frequency Postgraduate Student Colloquium, Sep. 8 and 9, 2003, pp. 128-131.
U.S. Appl. No. 15/229,915, filed Aug. 5, 2016, Josefsberg et al.
U.S. Appl. No. 15/379,860, filed Dec. 15, 2016, Josefsberg et al.

\* cited by examiner

Single sideband phase noise

ULTRA LOW PHASE NOISE FREQUENCY SYNTHESIZER

CROSS-REFERENCE TO RELATED APPLICATIONS

This application is a continuation of U.S. application Ser. No. 15/229,915, filed Aug. 5, 2016, which claims priority to U.S. Provisional Patent Application No. 62/181,221 filed on Jun. 18, 2015. The entire disclosure of each of the above applications is incorporated herein by reference.

FIELD

Embodiments of the present disclosure is generally related to systems to provide ultra low phase noise frequency synthesizer and in particular relate to systems to provide ultra low phase noise frequency synthesizer based on using combination of Fractional-N PLL (Phase Lock Loop), Sampling Reference PLL and DDS (Direct Digital Synthesizer).

BACKGROUND

Wireless Communication Technologies have completely revolutionized how millions of peoples in today's world are communicating to each other in a seamless manner. From their early infant days of late 1800's till today the concept of wireless communications have matured beyond our wildest imaginations. Amongst all those technological advances related to the field of wireless communication technologies, the only thing which has remained constant is the application of radio waves. On one hand radio waves can help us achieve communication between people who are located in close proximity of few meters. In the same manner in deep space radio communications those same radio waves can also help us achieve crystal clear communication between humans who are millions of kilometers away from each other.

Wireless Communication Technologies have branched into multiple different formats like Two-Way Radio Communications, Satellite Communications, Infrared Communications, Mobile Communications, Microwave Communications, Wireless Data Communications, Wi-Fi, Bluetooth Technology etc. Each and every single one of the above disclosed wireless communication technologies have evolved tremendously and become much more sophisticated and state of the art. In this patent application we will specifically deal with systems associated with Mobile Communications.

The evolution of mobile communication technologies from their initial 1G (1 Generation) days of 1970 till 2016 which is today's high speed 4G (4 Generation) technologies have enriched human lives in different shapes and sizes. The biggest impact which these gradual evolutions of mobile communication technologies have brought into our lives is the humongous increase in data speed which has enabled seamless communications between millions of peoples. Where 1G technology enabled communication systems used to provide us simple voice communications at only 10 Kbps data rate, the theoretical download data rate of the most advanced mobile communication technologies as of 2016 which is LTE-Advanced (Long Term Evolution) has been proposed as 1 Gbps. This quantum jump in data rate from 10 Kbps to 1 Gbps has left tremendous impact into common peoples' lives.

Without the availability of the advanced state of the art communication systems in today's markets like smart phones, it is not at all possible to access those high speed data rates. One of the most important hardware element present in those state of the art systems like smart phones, are frequency synthesizers. Frequency Synthesizers are a major building block in almost every communication systems, such as advanced mobile communication systems (LTE, LTE-Advanced), satellite communication systems, radar communication systems and so on.

An example frequency synthesizer provides a frequency output signal to other parts of the transmitter and receiver so as to enable the system to operate at the set frequency band. The performance of the frequency synthesizer determines the performance of the communication link. The main important features of every synthesizer are: a) Output frequency range, b) Output frequency resolution, c) Switching speed between channels and d) Spectral purity: Phase noise, spurious and harmonics etc. Amongst all those above mentioned features phase noise is the most important. The level of phase noise determines the modulation scheme that can be implemented in the system hardware and thus it determines the associated data rates and the communication ranges of the systems.

If a communication system provides higher data rate the system is more efficient, and it takes less time to download and upload data from the network. A higher data transfer rate can even save battery time because the transmission can be turned off much faster. A higher order modulation scheme implemented in the state of the art communication systems enables those systems to push more information in the wireless channels. However, the modulation scheme is limited by phase noise. Hence to implement those higher modulation schemes in the existing state of the art communication systems we need to reduce the phase noise.

Most modern communication systems use sophisticated modulation schemes that are based on a combination of different phases and amplitudes. The current most advanced modulation scheme which is running in most of the smart phones or tablets is 256 QAM (256 Quadrature Amplitude Modulation). In this modulation scheme, the smallest phase deviation for error ($\Delta\phi$) theoretically is 3.7°. Practically, to be on the safe side, it is desired to work with nicely lower number. As 10% is considered safe, hence the current generation of frequency synthesizers work with 0.4°-0.5°. The current generation of single loop frequency synthesizers inherently does not enable to go to much lower phase error due to phase noise.

The current generation of advanced state of the art communication systems typically includes a front end module and a System on Chip (SoC). The frequency synthesizer is part of the SoC and is implemented mostly in CMOS. The front end module usually contains a low noise amplifier for the receiver, the power amplifier for the transmitter and some switch matrix. The SoC includes all the signal processing elements along with the frequency synthesizers. Currently the Wi-Fi and/or LTE synthesizers in the SoC set the limit for the performance of the system. As a result, the multi-billion dollar market remains at a technological standstill.

Further, in many communication systems, Digital Pre-Distortion (DPD) is an algorithm that aims to pre-distort transmitted signals in order to improve linearity. In practical terms, it means that the transmitter is not completely linear and is distorting the signal. And that basically also prevents the system to be as effective as much as possible. So one approach is to correct it is by using some algorithms to pre distort the signal in the opposite way. To do this efficiently, the DPD algorithm requires the amplitude and phase data about the transmitted data.

Traditional radio systems either utilize the receive path of the radio or a special down-conversion mechanism followed by a high-resolution analog to digital converter to capture the small non-linearities of the transmit path. The main problem with the above mechanism is that non-linearities and phase noise of the receive path or special down-conversion path get added to the signal and the DPD algorithm cannot separate the non-linearities and the phase noise generated and added during the down-conversion from the ones that were actually created in the transmit path and need correction.

The transmit path nonlinearities; can come from any component such as low frequency amplifier, mixer, up-converter, driver amplifier. Specifically the Power Amplifier (PA) is the main source of nonlinear distortions in the transmit path and the main goal of the DPD algorithm is to pre-distort this to achieve a cleaner signal. As mentioned above all the receive path nonlinearities are added to the transmit path with no way to distinguish between the two.

Hence, there is a need for a low phase noise frequency synthesizer that can overcome the problems of prior art, enable higher modulation schemes and high data rate by reducing phase noise, resolve the locking problem in the sampling PLLs and minimize DPD distortions in received signals. The target of the present disclosure is to enable much lower level of phase deviation for error ($\Delta\emptyset$) which should be in the range of 10% of current designs, or 0.04° and thus enables much higher order modulation schemes and enables an efficient DPD algorithm.

SUMMARY

The present disclosure is discussed in reference to state of the art wireless communication systems (smart phones) for exemplary purposes only. It is contemplated that the present disclosure is applicable to any state of the art wireless communication systems which enables consumers to communicate with each other in a seamless manner.

According to a first embodiment of the present disclosure a system comprising one ultra low phase noise frequency synthesizer is provided. The system is made up with a front end module, a display screen and one System on Chip (SoC) module. The ultra low phase noise frequency synthesizer is part of the SoC module. The ultra low phase noise frequency synthesizer comprises one main PLL (Phase Lock Loop) and one reference sampling PLL. The main PLL comprises one high frequency DDS (Direct Digital Synthesizer), one Digital Phase Frequency Detector, one main VCO (Voltage Controlled Oscillator), one frequency divider and one down convert mixer. The reference sampling PLL comprises one TCXO (Temperature Compensated Crystal Oscillator), one sampling phase detector, and one reference VCO. This embodiment provides multiple improvements in system output which are based on the following technical approaches—a) using of dual loop approach to reduce frequency multiplication number, b) using of sampling PLL as the reference PLL to make its noise contribution negligible, c) using of DDS to provide high frequency input to the main PLL and d) using of high frequency Digital Phase Frequency Detector in the main PLL.

According to a second embodiment of the present disclosure a system comprising one ultra low phase noise frequency synthesizer is provided. The system is made up with a front end module, a display screen and one System on Chip (SoC) module. The ultra low phase noise frequency synthesizer is part of the SoC module. The ultra low phase noise frequency synthesizer comprises one main PLL (Phase Lock Loop) and one reference sampling PLL. The ultra low phase noise frequency synthesizer comprises one single TCXO (Temperature Compensated Crystal Oscillator) which provides input clock signals to both the main PLL and the reference sampling PLL. The main PLL further comprises one Fractional-N Synthesizer chip, one primary VCO (Voltage Controlled Oscillator) and one down convert mixer. The Fractional-N Synthesizer chip includes one Digital Phase Detector and one software controllable variable frequency divider. The reference sampling PLL comprises one sampling PLL, and one reference VCO. This embodiment provides multiple improvements in system output which are based on the following technical approaches—a) using of dual loop approach to reduce frequency multiplication number, b) using of sampling PLL to make its noise contribution negligible, c) instead of a DDS clock like in the previous embodiment, using of a high frequency TCXO clock to provide high frequency input to the main PLL, and d) using of a high frequency Fractional-N Synthesizer chip in the main PLL.

According to a third embodiment of the present disclosure a system comprising one ultra low phase noise frequency synthesizer is provided. The system is made up with a front end module, a display screen and one System on Chip (SoC) module. The ultra low phase noise frequency synthesizer is part of the SoC module. The system comprises one sampling PLL (Phase Lock Loop), which is one of the most important building blocks of an ultra low phase noise frequency synthesizer. The sampling PLL comprises one TCXO (Temperature Compensated Crystal Oscillator), one Comb Generator, one Sampling Phase Detector, one DC switch, one Loop Filter, one VCO (Voltage Controlled Oscillator) and one Digital Synthesizer. In this embodiment, the loop filter is just a loop filter. The Digital Synthesizer acts as a phase detector when the loop is locked and as a frequency detector when the loop is open, forcing the loop to lock from any distance between the two frequencies. The loop will lock by the Digital Synthesizer. Once it is locked, the lock indicator will switch the PLL to the sampling PLL while keeping the same control voltage, thus keeping the loop locked.

The preceding is a simplified summary to provide an understanding of some aspects of embodiments of the present disclosure. This summary is neither an extensive nor exhaustive overview of the present disclosure and its various embodiments. The summary presents selected concepts of the embodiments of the present disclosure in a simplified form as an introduction to the more detailed description presented below. As will be appreciated, other embodiments of the present disclosure are possible utilizing, alone or in combination, one or more of the features set forth above or described in detail below.

BRIEF DESCRIPTION OF THE DRAWINGS

The above and still further features and advantages of embodiments of the present invention will become apparent upon consideration of the following detailed description of embodiments thereof, especially when taken in conjunction with the accompanying drawings, and wherein.

To facilitate understanding, like reference numerals have been used, where possible, to designate like elements common to the figures.

DETAILED DESCRIPTION

As used throughout this application, the word "may" is used in a permissive sense (i.e., meaning having the potential to), rather than the mandatory sense (i.e., meaning must). Similarly, the words "include", "including", and "includes" mean including but not limited to.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

Figure 1:
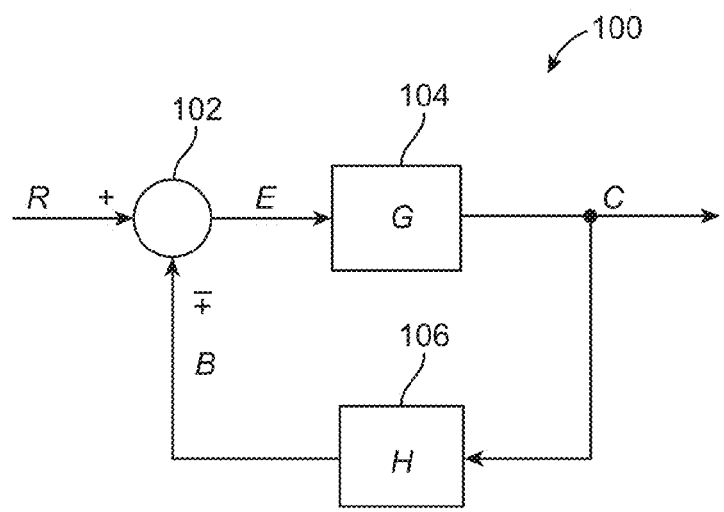
FIG. 1 illustrates a general block diagram of a negative feedback system.

FIG. 1 illustrates a general block diagram of a negative feedback system 100.

The negative feedback system 100 has an input R and an output C, a summer/comparator 102, a forward path function G 104 and a feedback path function H 106. The summer/comparator 102 compares the input R with a sample B of the output C fed back through function H 106, to produce an error signal E that is relative to the difference between the input R and the feedback sample B. This error signal E is fed to the main element G function 104 in the forward path. If the output signal C tends to drift upwards, the error signal E pushes it back downwards and vice versa. Thus, the negative feedback system 100 stabilizes the output signal C. The negative feedback system 100 finds applications in many systems for stabilizing frequency, output power, and many other functions.

Figure 2:
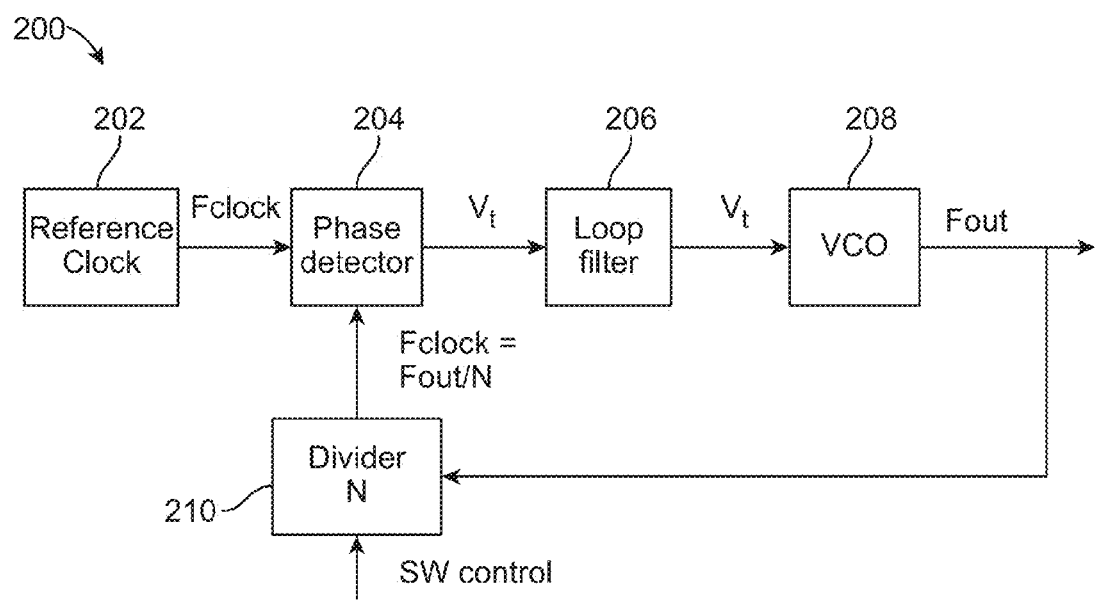
FIG. 2 illustrates a general block diagram of a standard Phase Lock Loop (PLL)

FIG. 2 illustrates a general block diagram of a standard Phase Lock Loop (PLL) 200.

The PLL 200 is a frequency feedback system comprising a reference clock 202, a digital phase/frequency detector (PFD) 204, a loop filter 206, a Voltage Controlled Oscillator (VCO) 208, and a frequency divider 210.

The VCO 208 is the main output block in the forward path, and is tuned to produce a frequency as set by a tuned circuit. The VCO 208 has a frequency output $F_{out}$ that can be changed by a control voltage $V_t$ over a pre-set range of frequencies.

The phase detector 204 is a comparator for both the clock input $F_{clock}$ and the feedback sample from the output $F_{out}$ divided by divider N 210. The phase detector 204 compares the two input frequencies $F_{clock}$ and $F_{out}/N$. When the two input frequencies are not equal, the device 204 acts as a frequency discriminator and produces either a negative or positive voltage, depending on the polarity of the frequency difference between the two inputs. When the two input frequencies are the device produces an error voltage $V_t$ relative to the phase difference between the two equal frequencies.

The loop filter 206 filters and integrates the error signal produced by the phase detector 204 and feeds it to the VCO 208. The loop filter 206 is usually based on passive components like resistors and capacitors, but also in some cases it is a combination of active devices like operational amplifier and passive components.

The reference clock 202 is in general a low frequency crystal oscillator signal source that feeds $F_{clock}$ to the phase detector 204, and to which the output signal $F_{out}$ is "locked". The reference clock 202 is set at some frequency for example a standard frequency 10 MHz The locking "mechanism" transfers some of the qualities of the reference clock 202 to the main output signal $F_{out}$. Its main features usually are: a) frequency stability over temperature—generally in the range of 0.1-5 ppm (parts per million), b) accuracy—Can be tuned to very high accuracy, c) very low phase noise—Its phase noise is transferred to the output signal multiplied by the ratio of 20*LOG(N) where N is the ratio between the output frequency and the clock frequency applied to the phase detector 204.

The frequency divider 210 is based on digital devices like gates and flip-flops, through which the input frequency $F_{out}$ is divided by a number N to produce $F_{out}/N$ which is fed to the other input of the phase detector 204. This number N is software controllable. The control signal comes usually from a micro controller or from a PC or from anywhere that basically will send software control to the frequency divider 210 to change the division number N. The target of the division number N is to enable the output frequency of the frequency divider 210 to be equal to the clock frequency of the reference clock 202.

The entire operational procedures of a standard Phase Lock Loop (PLL) 200 is as follows: If an input clock signal $F_{clock}$ is applied, usually by a reference clock 202, the phase detector 204 compares the phase and frequency of the input signal $F_{clock}$ with that of the VCO 208 divided by N, and generates an error voltage $V_t$ that is related to the difference in the two signals. The error voltage $V_t$ is then filtered and applied to the control of the VCO 208, thereby varying the VCO 208 frequency in a direction that reduces the frequency difference between the two signals. When the frequencies of the two signals become sufficiently close, the feedback nature of the system causes the system to lock with the incoming signal. Once in lock the VCO 208 frequency divided by N is identical with the input signal $F_{clock}$, except for a finite phase difference which is necessary to generate the corrective error voltage $V_t$ to shift the VCO 208 frequency to the input signal frequency $F_{clock}$, thus keeping the system in lock.

Any time, the division number N is changed, say for example by 1, the output frequency $F_{out}$ jumps exactly by a step. In an example, if the reference clock 202 generates a frequency 1 MHz, then every time the division number N changes by steps of 1, the output frequency $F_{out}$ changes by equal steps of 1 MHz.

Like all negative feedback systems, the PLL 200 has a loop bandwidth set by the component parameters and the loop filter 206. In other words, the PLL 200 is a sophisticated frequency multiplier with a built-in narrowband, automatically tuned band-pass filter as the output frequency $F_{out}$ is basically $F_{clock}$ multiplied by the number N. The loop bandwidth is also responsible directly for how fast the output frequency of PLL 200 may change between different frequencies. The PLL 200 is a device where the VCO 208 is locked to a single clock reference signal which is very low but also very clean and very stable and the output frequency can be changed by equivalent steps by controlling the frequency divider 210 in the feedback loop.

Figure 3:
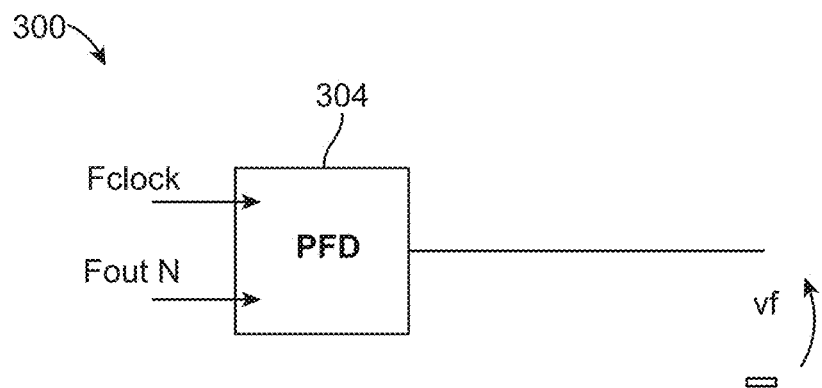
FIG. 3 illustrates a simplified drawing of a digital phase/frequency detector.

FIG. 3 illustrates a simplified drawing of a digital phase/frequency detector 204.

A phase detector or phase comparator is a frequency mixer, analog multiplier or logic circuit that generates a voltage signal which represents the difference in phase between two signal inputs. It is an essential element of the phase-locked loop (PLL). A specialized variant that additionally detects frequency is referred as Phase Frequency Detector (PFD). A phase-frequency detector is an asynchronous sequential logic circuit which determines which of the two signals has a zero-crossing earlier or more often. When used in a PLL application, lock can be achieved even when it is off frequency. Such a detector has the advantage of producing an output even when the two signals being compared differ not only in phase but in frequency.

The phase/frequency detector 204 compares two input frequencies $F_{clock}$ and $F_{out}/N$. When the two input frequencies are not equal, it acts as a frequency detector and produces one or zeros to produce a voltage control $V_t$ that pushes corresponding VCO 208 in the direction of the reference. In other words, if the VCO 208 is above the reference then the voltage control $V_t$ is high to push the VCO 208 down and vice versa. When the two input frequencies are the same and a frequency lock is achieved, the phase detector 204 acts as a phase detector and compares the two phases, and continues to produce an error voltage to control the frequency and phase of the output device.

Figure 4:
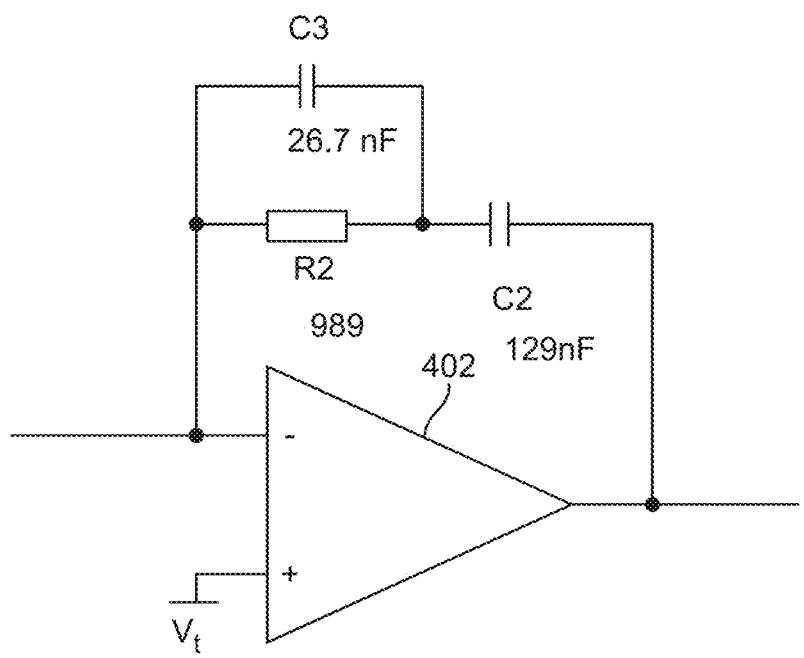
FIG. 4 illustrates an example of an active filter as applied to a general PLL.

FIG. 4 illustrates an example of an active filter as applied to a general PLL 400.

The kind of loop filter i.e. passive filter or active filter can be chosen on the basis of specific requirement. A passive loop filter is based on resistors and capacitors only, while an active loop filter is based on an amplifier and a capacitor-resistor network in the feedback system. A passive filter is preferred in cases where, a reference PLL is of a single frequency and will need only a single voltage in order to stay in that single frequency. The other reasons being simplicity, cost and most advantageously no addition of noise, as active devices tend to add additional noise in the system. However, active filters find more acceptances because of the possibility of amplification of the input signal. Amplification is made possible by an operational amplifier employed in the active filter.

The loop filter 206 of FIG. 2, is an active filter that includes an operational amplifier 402 and a capacitor-resistor network 404 in the feedback loop. In some instances, the phase detector 204 of the PLL 200 may produce voltage up to 5 volts but the corresponding VCO 208 may need a voltage of above 5 volts, say, for example, up to 18 volts in order to reach its complete range, so the active filter 206 facilitates not only filtering but also provides the capability to go to higher voltages.

Figure 5:
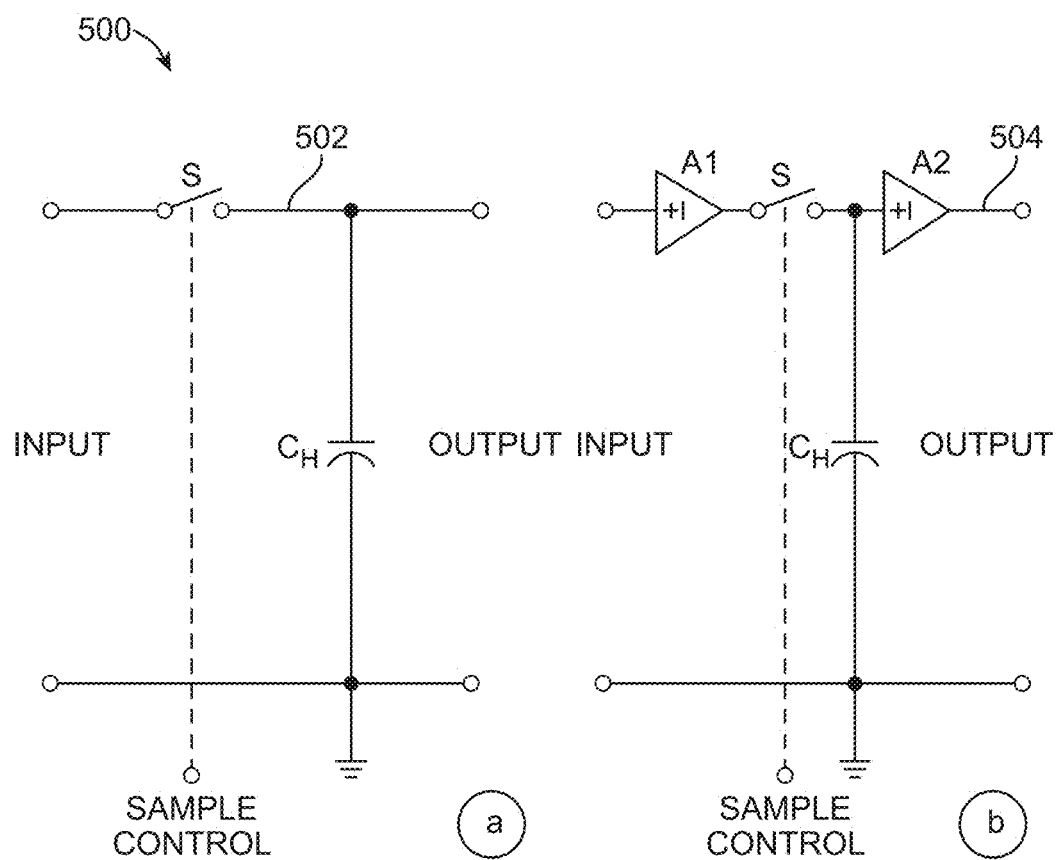
FIG. 5 illustrates the principle of sample-and-hold mechanism.

FIG. 5 illustrates the principle of sample-and-hold mechanism 500.

The first sample and hold circuit 502 includes a switch S and a hold capacitor $C_H$. The operation of the switch S is controlled by the sample control. When the switch S is closed, a voltage sample of the input frequency is sampled and when the switch is opened, the voltage sample is held on the hold capacitor $C_H$.

The second sample and hold circuit 504 includes two buffers A1 and A2 with unity gain for isolation purposes, in addition to the switch S and the hold capacitor $C_H$. The buffer A2 is preferably an electronic buffer, so that the hold capacitor $C_H$ does not discharge parasitically between consecutive samples. In other words, the hold capacitor $C_H$ holds the voltage between samples.

Figure 6:
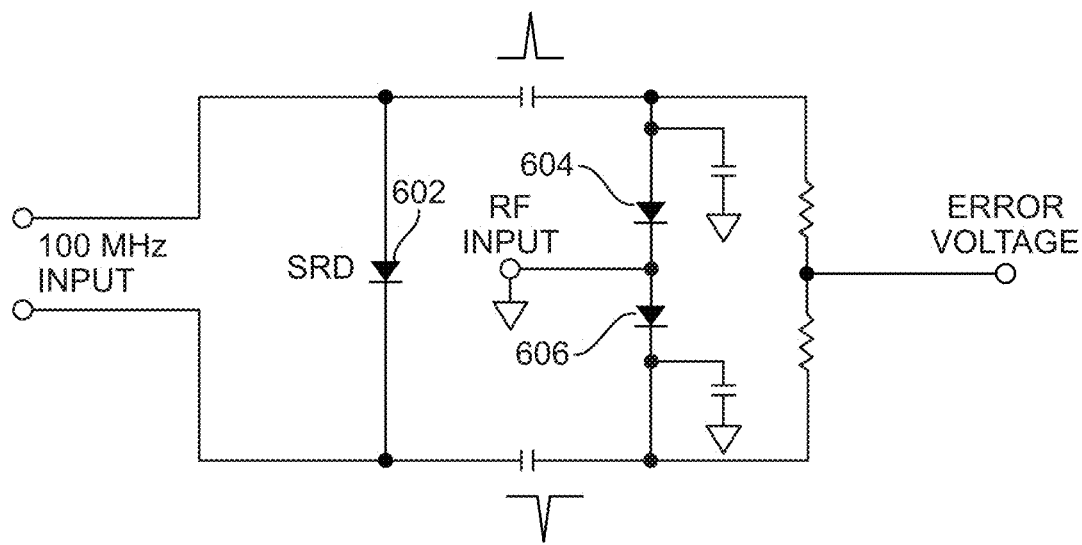
FIG. 6 illustrates a schematic of the step recovery diode as comb generator feeding the dual schottky diode that acts as phase detector.
Figure 7:
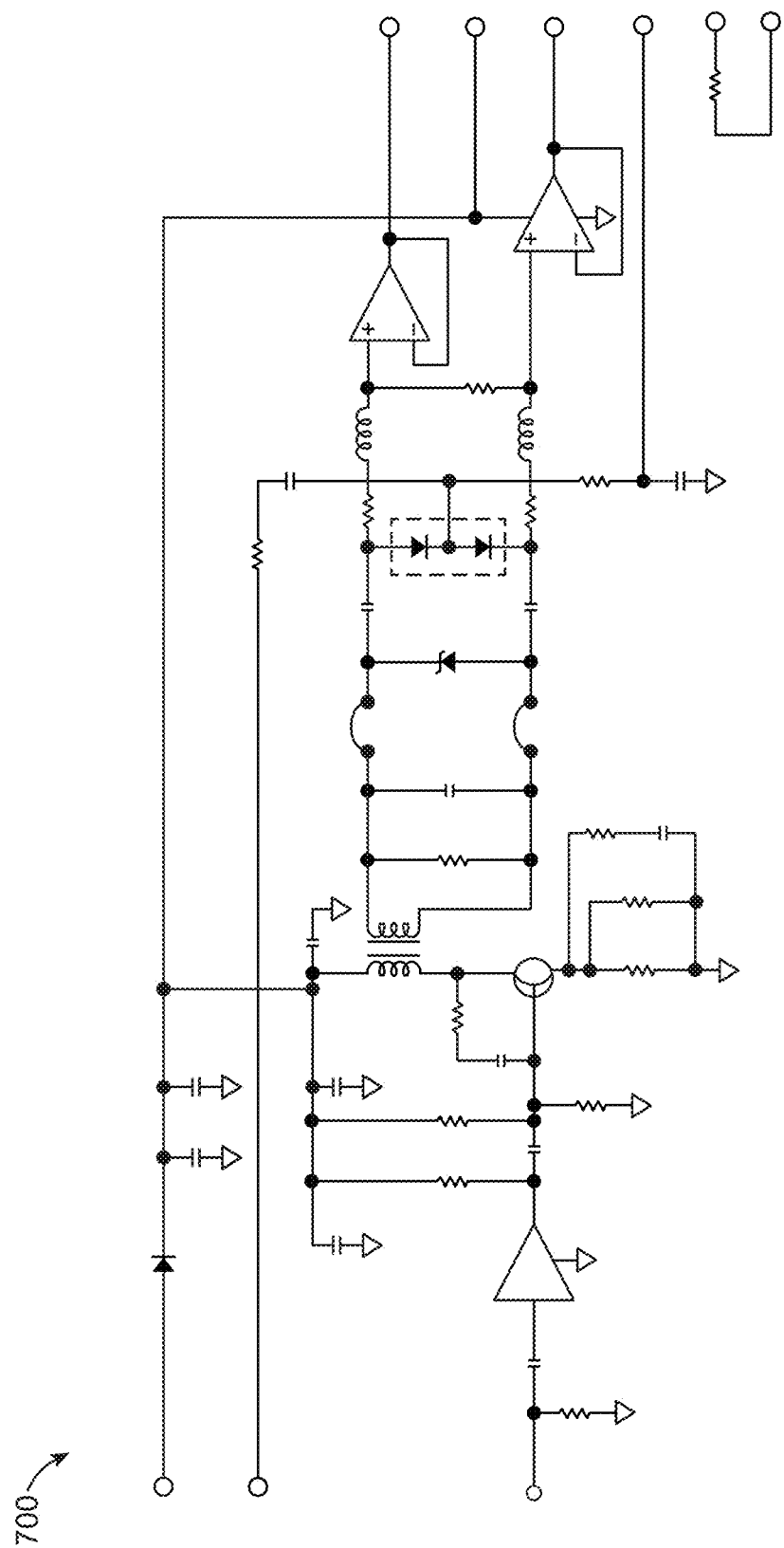
FIG. 7 illustrates a complete example schematic of the comb generator and sampling phase detector with RF preamplifier and two DC buffers following the phase detector.
Figure 8:
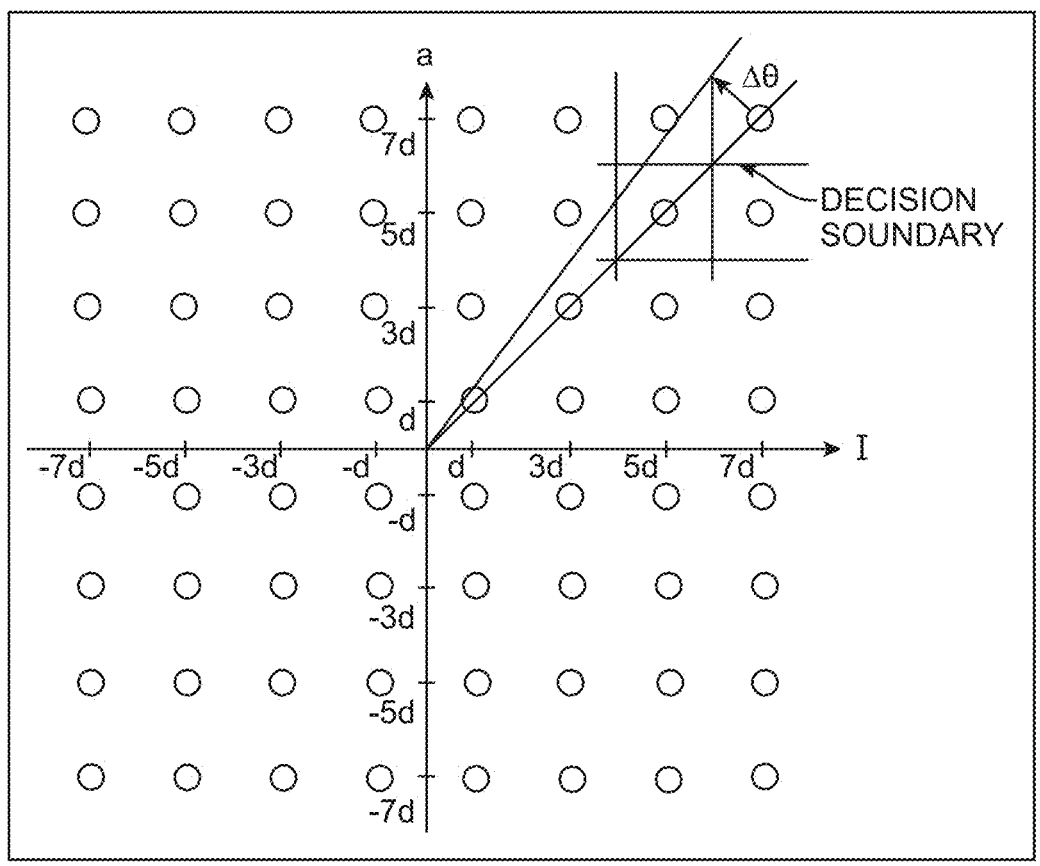
FIG. 8 illustrates a 64 QAM modulation scheme used in communication equipment.

FIG. 6 illustrates an example of practical implementation of a comb generator and sampling phase detector. The schematic shows a Step Recovery Diode (SRD) as comb generator feeding the dual schottky diode that acts as phase detector.

The implementation circuit 600 including a Step Recovery Diode (SRD) 602 as a comb generator and the dual schottky diodes 604 and 606 as a phase detector.

The input to the circuit 600 in this example is a clock input of 100 MHz sine wave. The SRD 602 is a special device that turns the 100 MHz sine wave input into a very narrow pulse train of the same frequency, so it acts as a comb generator. The two schottky diodes 604, 606 act as switches and act as sampling switches. The RF voltage (output from corresponding VCO) to be sampled is connected to a point between the two diodes 604 and 606. The SRD 602 creates an output of positive and negative pulses. The positive and negative pulses act as control signals to the diodes 604 and 606 that act like switches. The sampled voltage output is an error DC voltage which is created by sampling the RF input through the dual schottky diodes 604 and 606. The output of the RF signal is sampled whenever the diodes 604 and 606 are opened by the narrow pulses coming from the SRD 602. The voltage sample is held on the capacitors C following the diodes 604 and 606.

FIG. 700 illustrates a schematic of the comb generator and sampling phase detector with a clock pre-amplifier and two DC buffers following the phase detector.

The voltage samples are held on two very small capacitors (which are basically the input capacitance of the voltage buffers, no need for external capacitors) on both sides of the dual diode pair, so as not to enable the whole capacitor to discharge parasitically between the samples. These capacitors are buffered by a couple of ultra-low input bias current buffers to prevent discharge between samples. The two voltages are summed, fed to a loop filter, whereby the clean $V_t$ is fed to the VCO to control the frequency.

This implementation of sampling phase detector creates an analog phase detector, very similar to a mixer. The analog sampling phase detector has a certain defined locking space or locking distance, and it does not lock from any frequency difference like the phase/frequency digital detector. It has some locking range and only within that locking range, the VCO locks by itself on the reference. In a sampling PLL, the VCO does not lock on the reference, but on the Nth harmonic of the reference. In other words, one can lock a 9 GHz on the 90th harmonic of the 100 Megahertz clock. This is done as the input frequency is sampled every 100 cycles, not every cycle.

This type of product may contain some "search mechanism" to help lock the PLL. The most common one involves a positive feedback on the loop filter itself. While the loop is not locked, the loop filter acts as a very low frequency oscillator that drives the VCO back and forth across the frequency range. When it passes close enough to the harmonic of the clock, it will lock and stay locked. A nice feature of this mechanism is that it turns off automatically when the loop locks. This happens because of the nature of the loop as a negative feedback system.

However, this type of search mechanism suffers from many problems, its operation is subject to temperature changes and it makes this product difficult to produce, tune and sell successfully.

FIG. 800 illustrates a 64 QAM modulation scheme used in communication equipment.

Communication equipment, including different smart phones or tablets use a modulation scheme called Quadrature Amplitude Modulation (QAM). The QAM number defines the amount of points on a 2 dimensional chart that that is always the size of 1×1. The more points, the larger the density of the points. The signal has to be very clean for the points to be exactly where they are supposed to be so that the modem can decide easily. Phase noise is one of the bottlenecks that limit the data throughput. At a system level, phase noise is a statistical parameter that moves a modulation point along a curve just as a vector would move if it power would stay the same but the angle changes. If a certain modulation point moves too much on this curve, the modem will have a difficult time deciding where this point belongs and will flag an error.

In the QAM, delta ϕ or delta phase is the maximum error in degrees that is allowed to demodulate the data correctly. If the point moves by a phase of delta ϕ, it will be understood as a different point and in time the modulation scheme of course will have lot of errors. The 256 QAM allows a phase error of approximately 3 degrees in order to understand the data and the 64 QAM allows a phase error of approximately 7 degrees. By getting a better angle between 2 separate signals, one can achieve a much better more information per Hz, and a much higher data rate in modulation schemes, which can be very beneficial in many ways even improving battery life.

With our proposed ultra-low phase noise frequency synthesizers, the improved phase noise translated to degrees is better than 0.04 degrees, which when basically translated to modulation scheme can facilitate much higher modulation range. In other words, the points on the graph 800 can be much more crowded because there would be much more points in higher modulation level. The points may be much more crowded but if the phase noise is much better, it would be easy to distinguish between them without having problems of phase noise. With better phase noise, one may be able to push more information per Hz. On the same channel, one can get more information encoded and decoded. And basically it means that one can get better data rate.

Figure 9:
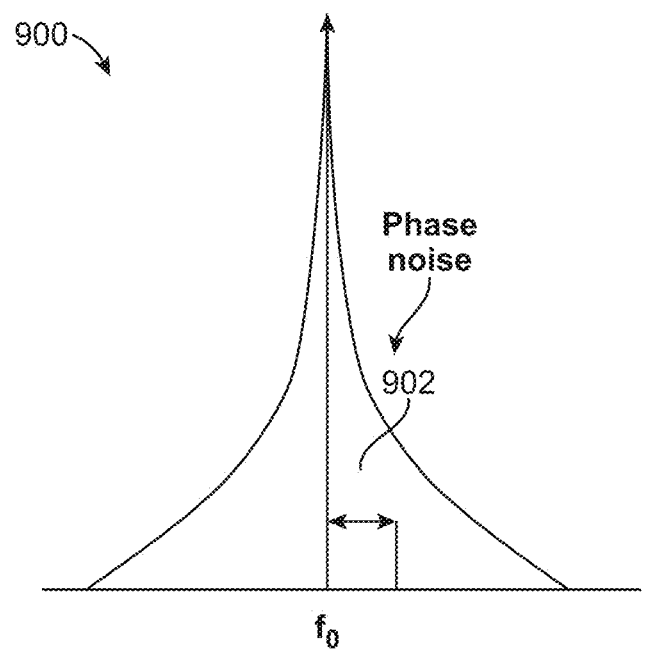
FIG. 9 illustrates a phase noise plot of an example free running Voltage Control Oscillator (VCO) in the frequency domain (spectrum analyzer), without being locked in a PLL.

FIG. 9 illustrates a phase noise plot 900 of an example free running Voltage Control Oscillator (VCO) in the frequency domain (spectrum analyzer), without being locked in a PLL.

As said before, Phase noise is a key element in many RF and radio communications systems as it can significantly affect the performance of systems. Phase noise is the frequency domain representation of rapid, short-term, random fluctuations in the phase of a waveform, caused by time domain instabilities also referred to as "jitter".

For example, in frequency domain, where the scales are amplitude vs. frequency, ideally a frequency of 100 MHz may look like a single line staying at exactly 100 MHz. However, practically with modern equipment in the laboratory, amplitude vs frequency may not look like a single line but it will look like a single line with a "skirt" 902 which goes wider and wider as we go down. The phase noise plot 900 looks like the skirt 902 on the left and the right of the exact desired frequency $f_0$. The quality, height, width of the skirt 902 determines how the phase noise may affect the system or the performance of the system. So, it is desirable to minimize phase noise as much as possible is to improve the system performance.

Phase noise is another term to describe short-term frequency stability. The signal generated by a frequency source is never practically "clean". Its frequency is never absolutely stable at the desired value. It has "Phase Noise" which is frequency shifting, i.e. small frequency shifts at different rates and different amplitudes of the main frequency. It changes around the center set frequency $f_0$ at different rates and amplitudes. In time domain, the phase noise may be referred to as jitter. Long term frequency stability is drift of the center frequency over time or over temperature.

Figure 10:
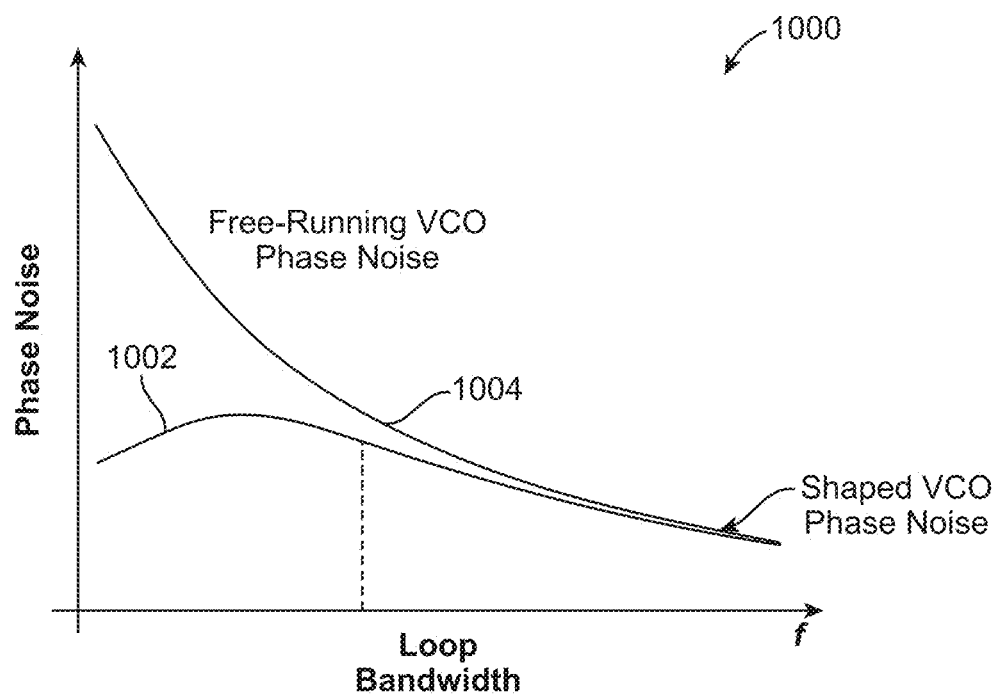
FIG. 10 illustrates a phase noise plot of an example Voltage Control Oscillator (VCO) in the frequency domain (spectrum analyzer), compensated by being locked in a PLL.

FIG. 10 illustrates a phase noise plot 1000 of an example Voltage Control Oscillator (VCO) in the frequency domain (spectrum analyzer), compensated by being locked in a PLL.

The upper line 1004 is the free running VCO phase noise, before it is locked in a PLL, and the lower line 1002 is the shaped VCO phase noise. In the PLL, the principle of locking the VCO to a reference frequency attenuates the phase noise of the VCO, in an amount related to the loop bandwidth. Outside the loop bandwidth, the VCO noise remains almost same as the phase noise without the PLL, while inside loop bandwidth it is attenuated more and more as offset frequency from the main carrier is reduced. At very high frequency, i.e. above the loop bandwidth, the locking almost has no effect, as the phase detector correction signal is not fast enough to reach the VCO for very fast changes or very fast disturbances. However, inside the loop bandwidth or at low frequencies, the compensated phase noise of the VCO is much lower than that of the free running VCO. All the frequencies that is close to the center of the frequency $f_0$ are easy to detect and compensate.

Figure 11:
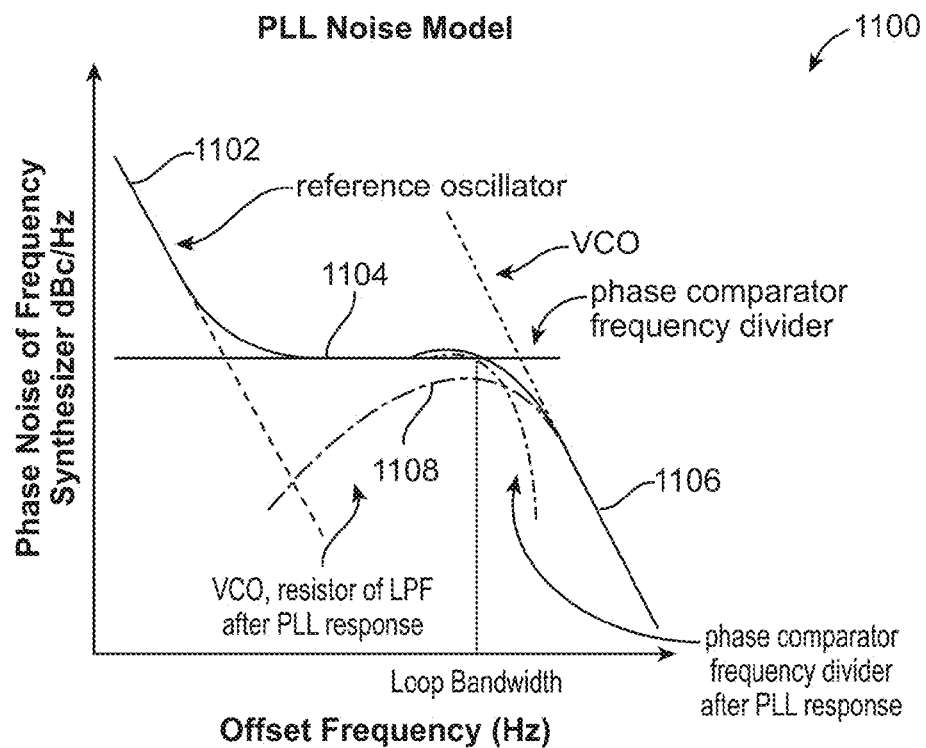
FIG. 11 illustrates two plots: (a) a simulation of phase noise of an example PLL, and (b) is an actual measurement.
Figure 11:
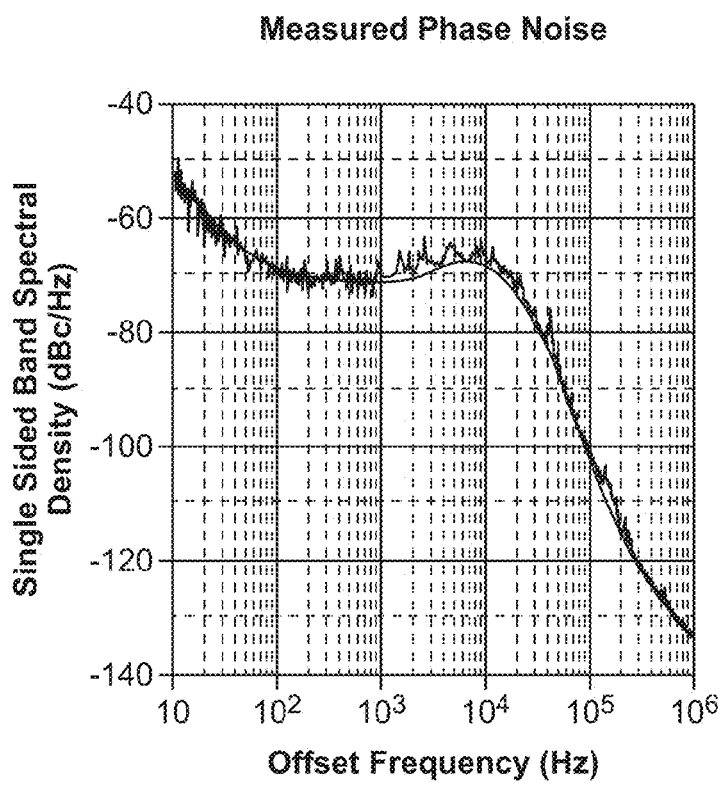

FIG. 11 illustrates two plots 1100: (a) a simulation of phase noise of an example PLL, and (b) an actual measurement.

FIG. 11(a) illustrates a simulation graph of phase noise of an example PLL. The simulation graph shows the overall phase noise of the example PLL and includes the contribution of all the components that contribute to the phase noise. The simulation graph illustrates first, second and third regions 1102, 1104 and 1106 of the phase noise. The first region 1102 which is very close to the carrier depicts a steep line which basically comes from the reference clock such as the Temperature Controlled Crystal Oscillator (TCXO, or any other reference clock device). The first region depicts the noise of the TCXO, multiplied by 20 log N, where N is the ratio of output frequency to the clock frequency. The second region 1104 depicts a flat phase noise which is basically the noise floor of the digital phase detector multiplied by the same ratio of 20 log N. The third region 1106 depicts a steep line which is the inherent VCO phase noise not affected by the loop bandwidth and locking phenomenon. The dashed line 1108 depicts the VCO "corrected" phase noise inside loop bandwidth. Below the flat area, the compensated VCO phase noise does not affect the overall result because it is way below the noise floor of the phase detector multiplied by that ratio. The actual measurement of phase noise of an example PLL is illustrated in FIG. 11(b). One can see clearly the similarity between the two curves.

Figure 12:
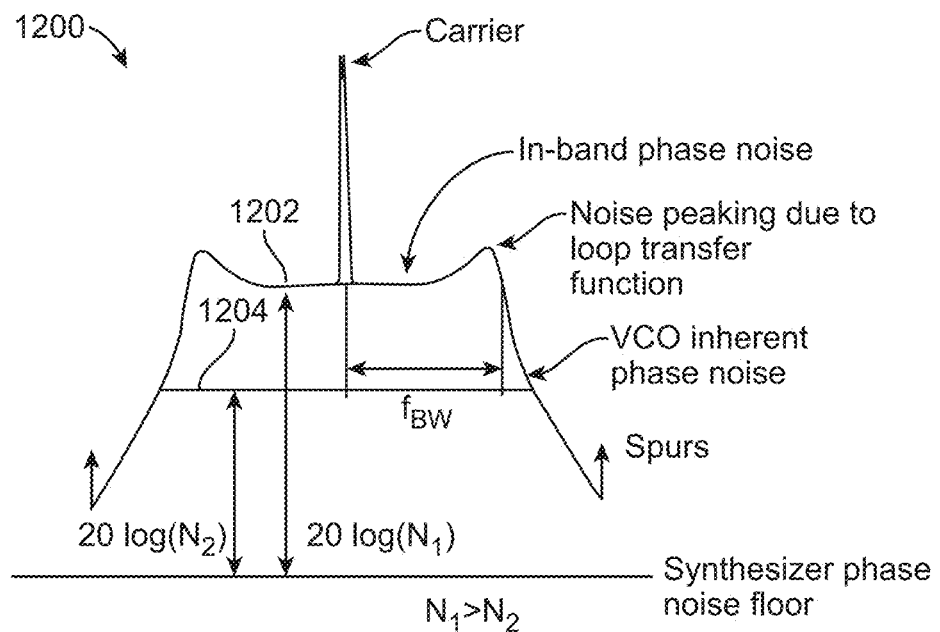
FIG. 12 illustrates a phase noise plot of a closed loop PLL, showing clearly the effect of the phase detector multiplication number 20*LOG(N) within loop bandwidth.

FIG. 12 illustrates a phase noise plot 1200 of a closed loop PLL, showing clearly the effect of the phase detector multiplication number 20*LOG(N) within loop bandwidth. The phase noise plot 800 illustrates phase noises on both sides of the carrier frequency $f_0$, where the left side is a mirrored image of the right side. The phase noises on both sides of the carrier $f_0$ looks like it is passing through a band-pass filter.

As illustrated, on both sides, the in-band phase noise inside the loop bandwidth is flat in shape and is equal to the phase detector and/or the reference clock noise multiplied by 20 log N. At the point of the loop bandwidth, the phase noise goes up before going down again. This is due to addition of 3 dB due to a combination of phase noise of the free running VCO and the phase detector. The upper straight line 1202 depicts a phase noise contributed by the phase detector at N1 and the lower straight line 1204 depicts a phase noise contributed by the phase detector at N2. It can be seen that, there is difference in phase noise in the flat area, due to two different "N" numbers. The phase detector contributes a higher in-band phase noise at a higher value of N.

Thus, in order to achieve low phase noise, it is essential to: a) choose components such as phase detector and reference clock with the lowest inherent phase noise possible, and b) lower the ratio number N as much as possible.

Figure 13:
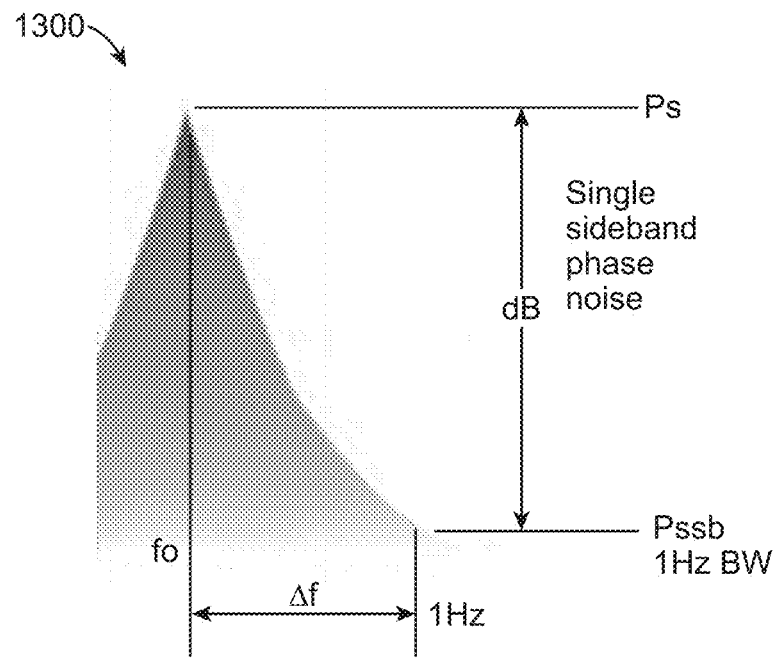
FIG. 13 illustrates a plot of measurement terms of phase noise in 1 Hz bandwidth at a Δf offset frequency from the carrier.

FIG. 13 illustrates a plot 1300 of measurement terms of phase noise in 1 Hz bandwidth at an Δf offset frequency from the carrier.

The phase noise expression is usually in dBc, i.e. dB relative to the carrier c power level Ps, in other words how low it is compared to the carrier per Hz, in a bandwidth of 1 Hz. That is basically the term that is used for phase noise, dBc per Hertz (dBc/Hz) at a certain Δf from the carrier.

As an example for the measurement method, suppose ΔF is 10 KHz, the phase noise power level Pss is measured at the level of −70 dBm on the spectrum analyzer, and the carrier power level Ps is measured at the level of 10 dBm, the ratio between the Ps 10 dBm and the PssB −70 dBm at 10 KHz from the carrier is therefore 80 dB, so the phase noise at 10 KHz offset from carrier and is −80 dBc/Hz.

For many systems, the important parameter to evaluate performance is not the phase noise measured at a single frequency offset from the carrier, but the integrated phase noise from one offset frequency to another one. Following are four different equations and terms to define integrated phase noise:

Integrated single sideband phase noise. (dBc)

$$\int L(f)df$$

Spectral density of phase modulation, also known as RMS phase error. (degrees)

$$S_{phi}(f) = (180/\pi) \cdot \sqrt{2 \cdot \int L(f) df}$$

Spectral density of frequency fluctuations, also known as RMS frequency error or residual FM. (Hz)

$$S_{nu}(f) = \sqrt{2 \cdot \int L(f) \cdot f^2 df}$$

Spectral density of fractional frequency fluctuations.

$$S_y(f) = S_{nu}(f)/f_{osc}$$

For example, the first equation defines the Phase Noise in dBc. It can be translated by the 2nd equation to degrees (relevant in respect of learning modulation schemes). As per further equations, the phase noise can also be translated in terms of Hz and time domain phase jitter seconds.

Figure 14:
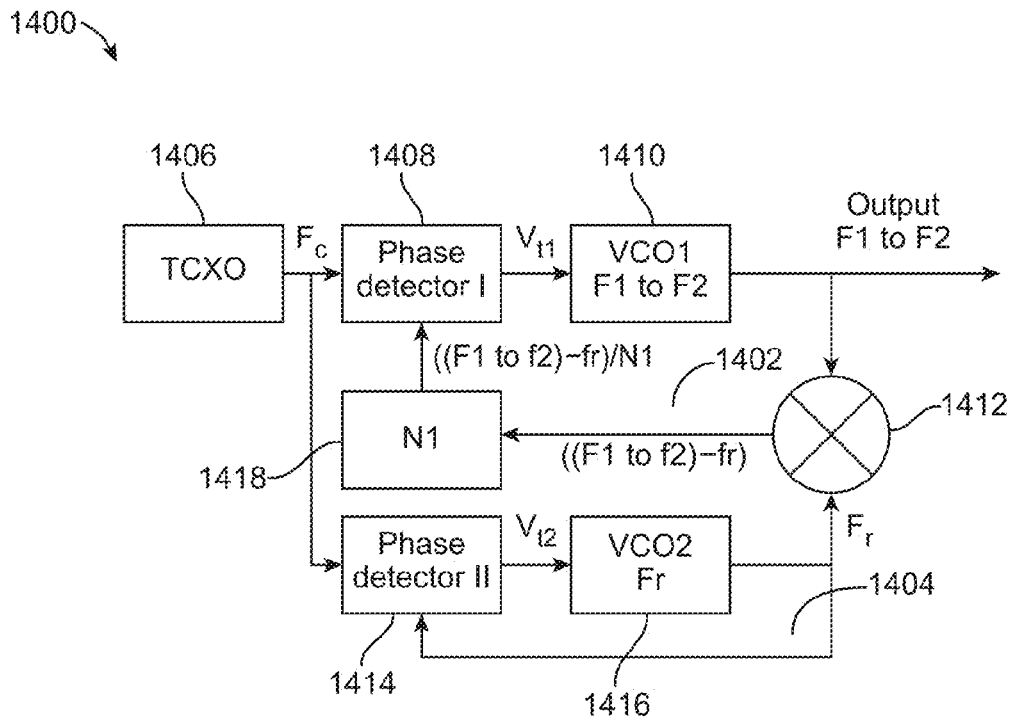
FIG. 14 illustrates a general block diagram of an example dual loop PLL.

FIG. 14 illustrates a general block diagram 1400 of an example dual loop PLL. The main target of the dual loop design is to reduce the number N.

The dual loop PLL 1400 includes an upper PLL 1402, referred to as a main PLL 1402, and a lower PLL 1404, referred to as a reference PLL 1404, a TCXO 1406 operating as a master clock, feeding a clock signal $F_c$ to both the primary PLL 1402 and the reference PLL 1404.

The reference PLL 1404 includes a first phase detector 1414, and a single frequency first VCO 1416 that operates at a reference frequency $F_r$. The reference frequency $F_r$ is fed to a first input of a down convert mixer 1412.

The main PLL 1402 includes a second phase detector 1408 and a second VCO 1410 that generates an output frequency range $F_1$ to $F_2$. A sample of the output frequency range $F_1$ to $F_2$ is fed to the second input of the down convert mixer 1412 and mixed with a single reference frequency $F_r$. The output from the down convert mixer 1412 is at a much lower frequency $(F_1$ to $F_2)-F_r$. This lowered frequency is fed back to the second phase detector 1408 through a frequency divider 1418 of value N1.

Therefore: a) Without the down convert mixer 1412: $F_1$ to $F_2 = N \times F_c$, b) With the down convert mixer 1412: $(F_1$ to $F_2) - F_r = N1 \times F_c$. As a result there is a reduction in the number N: $N1/N = ((F_1 \text{ to } F_2) - F_r)/(F_1 \text{ to } F_2)$.

The N1 number is basically the division number that the frequency divider 1418 will use to divide the output of the mixer 1412 and feed to the second phase detector 1408. The value of N1 is set as minimal, as the output from the mixer 1412 is at a much lower frequency than original frequency range $F_1$ to $F_2$.

To give an example: a) Suppose $F_c = 1$ MHz, b) Suppose $F_1$ to $F_2 = 10,000$ to $11,000$ MHz. Then N=10,000 to 11,000. Now If $F_r = 9000$ MHz, then $((F_1 - F_2) - F_r) = 1000$ to $2000$ MHz. Then N1=1000 to 2000. Thus, the value of N is reduced from 11,000 to 2000. In dB, it is a ratio of 15 dB. This means, that the phase noise is reduced by a factor of 15 dB.

The disadvantage of the example dual loop design is that while nicely reducing the number N in the main PLL, the reference PLL, containing a digital phase/frequency detector becomes the main factor contributing to the overall output phase noise.

Figure 15:
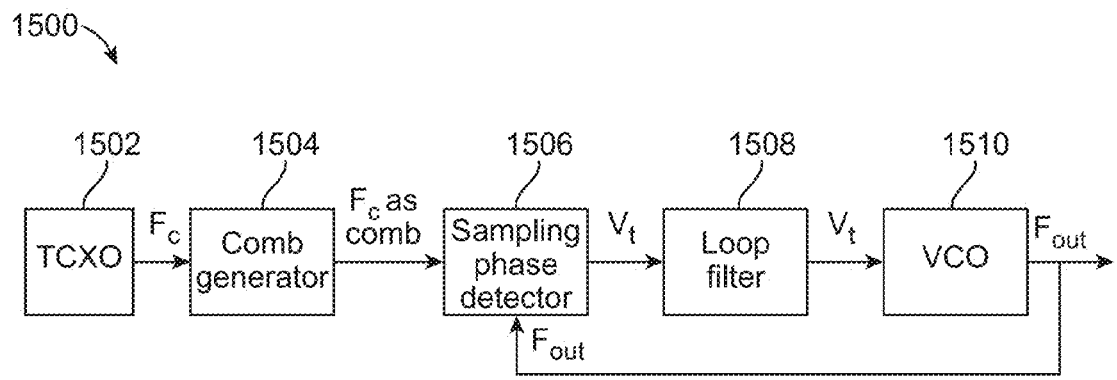
FIG. 15 illustrates a general block diagram of an example dual sampling PLL.

FIG. 15 illustrates a general block diagram 1500 of an example sampling PLL.

The sampling PLL 1500 includes a TCXO 1502, a comb generator 1504, a sampling phase detector 1506, a loop filter 1508, and a VCO 1510. The sampling PLL 1500 does not include digital phase/frequency detector and frequency divider. Thus, no digital noise floor is generated that can be multiplied and affect performance of the system.

The TCXO 1502 feeds the clock signal $F_{clock}$ to the comb generator 1504. The comb generator 1504 is a device that changes the input sine wave signal at frequency $F_{clock}$ to an output signal of very narrow pulses at the same frequency as the input sine wave signal.

The pulse output from the comb generator 1504 is used as a control signal to the sampling phase detector 1506. The sampling phase detector 1506 receives an RF signal of frequency $F_{out}$ from the VCO 1510, and includes two diodes acting as switches to sample the RF signal by opening and closing the diodes based on the narrow pulses from the comb generator 1504. The sampled voltage $V_t$ produced is "held" on capacitors and buffered until the next sample period. The voltage samples are always at the same level, thus a DC voltage $V_t$ is generated by the sampling phase detector 1506. The loop filter 1508 cleans and filters the DC voltage Vt, and provides it to the VCO 1510 to control the VCO frequency $F_{out}$. $F_{out} = F_{clock} *N$, where N is the $N^{th}$ spectral harmonic line in the "comb" spectrum.

Figure 16:
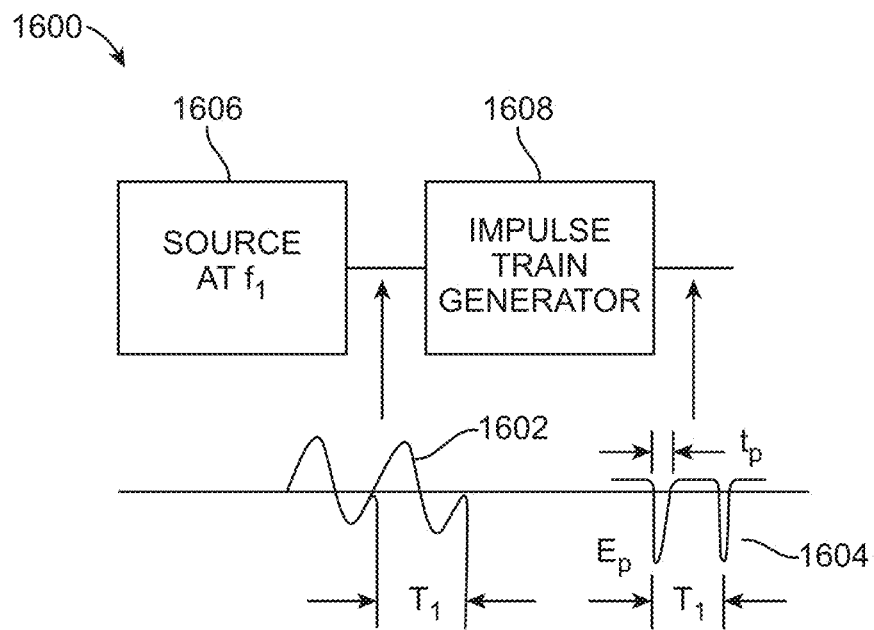
FIG. 16 illustrates how impulse or "comb" generator changes a wave shape of a signal from sine wave to pulses.

FIG. 16 illustrates how the impulse or "comb" generator 1504 changes a wave shape of a signal from sine wave 1602 to narrow pulses 1604. A frequency source 1606 generates the input sine wave 1602 of frequency F1 and time period T1.

The comb generator 1504 turns the input sine wave 1602 to a series of very narrow pulses 1604 with same time period T1, and a pulse bandwidth as $t_p$ in the time domain. For example, if the frequency of input sine wave 1602 is 100 MHz, then the impulse train generator 1504 generates a series of very sharp narrow pulses 1604 of the same frequency.

Figure 17:
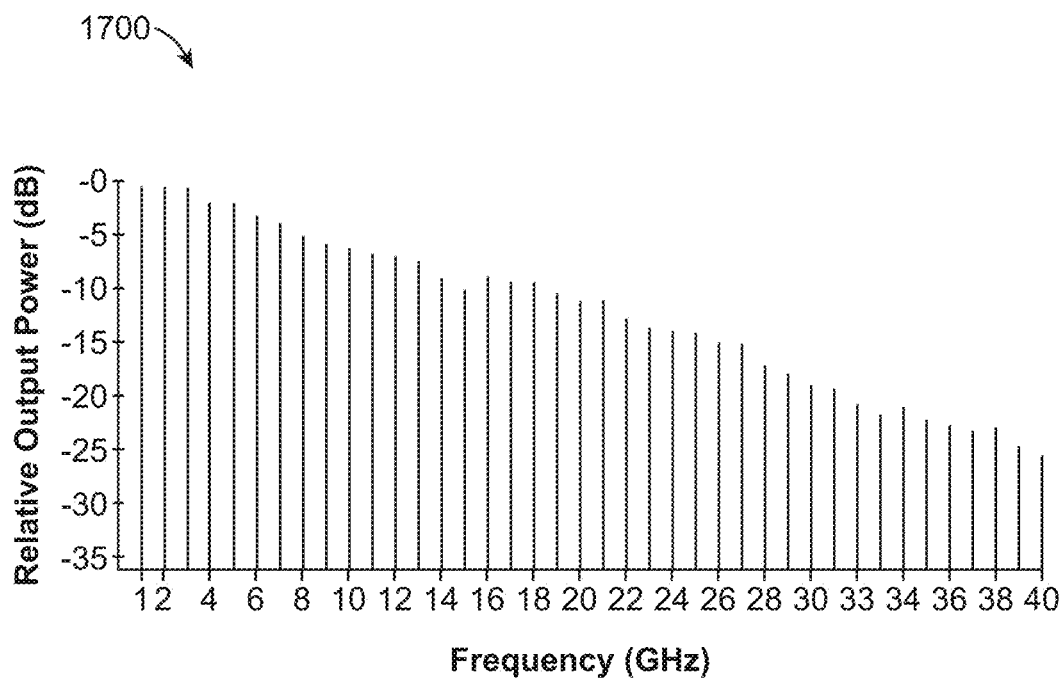
FIG. 17 illustrates an example output of a comb generator in the frequency domain.

FIG. 17 illustrates an example output 1700 of a comb generator 1504 in the frequency domain.

In the frequency domain (spectrum analyzer screen), the output 1700 of the comb generator 1504 looks like a "comb", i.e. a row of lines extending up to very high frequency. In theory, if the bandwidth of the clock pulse is infinitesimal, the row of lines appear with equal amplitude to infinity. The output 1700 looks like a series of lines, with the spacing between the lines same as the initial frequency. In an example, if the initial frequency is 1 GHz, the spectrum of lines is 1 GHz apart.

Figure 18:
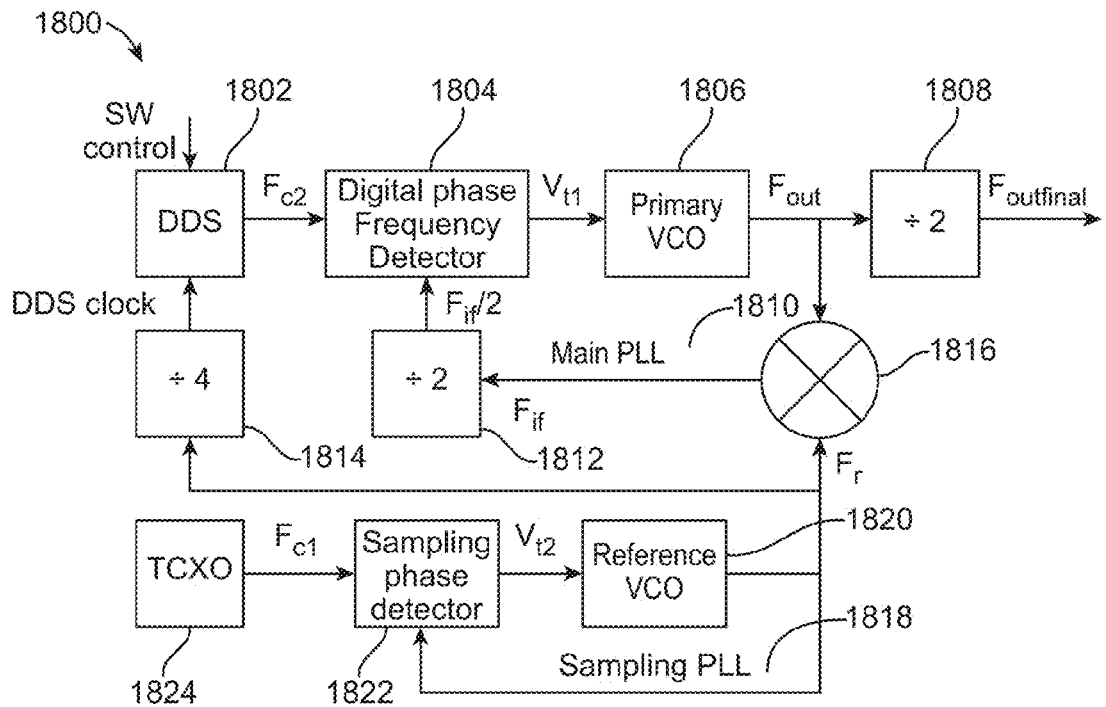
FIG. 18 illustrates a block diagram of an ultra-low phase noise frequency synthesizer as suggested in a first embodiment.

FIG. 18 illustrates a block diagram 1800 of an ultra-low phase noise frequency synthesizer as suggested in a first embodiment.

The ultra-low phase noise frequency synthesizer 1800 includes two Phase Lock Loops (PLLs). One is a main PLL 1810 and the other one is a sampling PLL 1818. The main PLL 1810 comprises of a high frequency low noise Direct Digital Synthesizer (DDS) 1802 to generate at least one clock signal $F_{c2}$ of variable frequency range. The high frequency low noise DDS 1802 generates the at least one clock signal $F_{c2}$ of variable frequency range by taking input from at least one software controllable instructions and at least one DDS clock signal. The frequency of the at least one clock signal $F_{c2}$ is always lower than the frequency of the at least one DDS clock signal. The at least one DDS clock signal is generated by a first fixed frequency divider 1814. The high frequency low noise DDS 1802 forwards the generated at least one clock signal $F_{c2}$ of variable frequency range towards a Digital Phase Frequency Detector 1804.

The Digital Phase Frequency Detector 1804 compares two signals coming from two directions and generates at least one signal. One signal is the at least one clock signal $F_{c2}$ of variable frequency range generated by the high frequency low noise DDS 1802. The second signal is at least one signal of frequency $F_{if}/2$ generated by a second fixed frequency divider 1812. The Digital Phase Frequency Detector 1804 compares these two signals and generates at least one first control voltage $V_{t1}$ and forwards it towards a primary Voltage Control Oscillator (VCO) 1806. The primary Voltage Control Oscillator (VCO) 1806 generates at least one output signal of frequency $F_{out}$ from the received at least one first control voltage $V_{t1}$. The main PLL 1810 further comprises a down convert mixer 1816.

The primary role of the sampling PLL 1818 is to help the main PLL 1810 in reducing the phase noise present in the at least one output signal $F_{out}$. The sampling PLL 1818 comprises a Temperature Compensated Crystal Oscillator (TCXO) 1824 to generate at least one first clock signal of a fixed single frequency $F_{c1}$, a sampling phase detector 1822 (that includes the comb generator and the sampling phase detector) to generate at least one second control voltage $V_{r2}$ and a reference Voltage Control Oscillator (VCO) 1820.

One important thing to notice here is that unlike other dual loop designs, the sampling reference PLL 1818 uses the sampling phase detector 1822. The sampling PLL 1818 does not use any kind digital devices like the Digital Phase Frequency Detector 1804, or the first fixed frequency divider N1 1814. Simultaneously the Temperature Compensated Crystal Oscillator (TCXO) 1824 present in the sampling PLL 1818 is also a very low noise generating device. Due to these reasons the contribution of phase noise from the sampling PLL 1818 to the main PLL 1810 becomes close to negligible. The reference Voltage Control Oscillator (VCO) 1820 generates at least one reference signal Fr and forwards it towards the down convert mixer 1816. The sampling PLL 1818 plays a major part in all relevant communications and similar systems by being part of various frequency synthesizers, and also as a standalone frequency source for all the systems of up and down conversion processes in the same equipment.

The down convert mixer 1816 based on the received at least one reference signal of frequencies Fr and at least one output signal of frequency $F_{out}$ generates at least one intermediate signal of frequency $F_{if}$ and forwards it towards a second fixed frequency divider 1812. The second fixed frequency divider 1812 generates at least one signal of frequencies $F_{if}/2$ by dividing the incoming at least one signal of frequency $F_{if}$ by a predefined factor. The second fixed frequency divider 1812 forwards the generated at least one signal of frequencies $F_{if}/2$ towards the Digital Phase Frequency Detector 1804. The primary VCO 1806 forwards the at least one output signal $F_{out}$ towards a third fixed frequency divider 1808 to generate at least one final output signal $F_{outfinal}$.

It is important to notice that frequency divider 1812 is optional and the main PLL can operate without division of $F_{if}$.

To explain the above disclosed disclosures with an example let's say the TCXO 1824 generates the at least one first clock signal of a fixed single frequency $F_{c1}$ 250 MHz. The sampling phase detector 1822 generates the second control voltage $V_{r2}$ by sampling the at least one first clock signal of a fixed single frequency $F_{c1}$ 250 MHz and forwards the sampled values of the at least one first clock signal of a fixed single frequency $F_{c1}$ 250 MHz towards the reference Voltage Control Oscillator (VCO) 1820. The reference Voltage Control Oscillator (VCO) 1820 generates the at least one reference signal Fr and forwards it towards the down convert mixer 1816. In an example, the reference VCO 1820 generates two reference signals having sampling frequencies of 11.75 GHz and 12.75 GHz.

In the example, the first frequency divider 1814 divides the generated 2 reference signals of frequencies 11.75 GHz and 12.75 GHz by a predefined factor of 4 to generate the at least one DDS clock signal. The high frequency low noise DDS 1802 receives the at least one DDS clock signal, and based on the at least one software controllable instructions, generates the at least one clock signal $F_{c2}$ of variable frequency range from 0.525 GHz to 1 GHz.

In the example, the primary VCO 1806 generates the at least one output signal of frequency $F_{out}$ ranging from 9.8 GHz to 11.7 GHz. The down convert mixer 1816 mixes the at least one output signal of frequency $F_{out}$ ranging from 9.8 GHz to 11.7 GHz with the two reference signals $F_r$ at frequencies 11.75 GHz or 12.75 GHz to generate the at least one intermediate signal $F_{if}$ having frequency ranges from 1.05 GHz to 2 GHz. Since the at least one clock signal $F_2$ ranges from 0.525 GHz to 1 GHz, the second fixed frequency divider 1812 is set to divide the at least one intermediate signal $F_{if}$ by a predefined factor of 2, to generate the at least one signal of frequencies $F_{if}/2$ ranging from 0.525 GHz to 1 GHz.

The third fixed frequency divider 1808 divides the at least one output signal $F_{out}$ ranging from 9.8 GHZ to 11.7 GHz by a predefined factor of 2 to generate the at least one final output signal $F_{outfinal}$ ranging from 4.9 GHz to 5.85 GHz. The frequency range 4.9 GHz-5.8 GHz is basically taken from a standard design in smart phones (Wi-Fi 5 GHz Band). It is easier and relatively inexpensive to implement the chip design of the frequency synthesizer 1800 for higher output frequencies 9.8 GHZ to 11.7 GHz, and then divide the at least one output signal $F_{out}$ by 2 to generate the at least one final output signal $F_{outfinal}$ in the range of 4.9 GHz-5.8 GHz.

The down convert mixer 1816 lowers the frequency of the at least one output signal $F_{out}$, to reduce ratio of the frequencies of the second clock signal and the feedback signal. Instead of feeding the at least one output signal $F_{out}$ directly to the Digital Phase Frequency Detector 1804, it is mixed down to create at least one signal with much lower frequency, and obtain a much lower value of the second fixed frequency divider 1812.

As the primary phase noise present in the ultra-low phase noise frequency synthesizer 1800 is due to the product of the noise present in the high frequency DDS 1802 and the second fixed frequency divider 1812, the more less the value of the second fixed frequency divider 1812 will be, the more less will be the generated phase noise in the ultra-low phase noise frequency synthesizer 1800. Therefore when the second fixed frequency divider 1812 is equal to 2, the DDS signal noise is multiplied by the number 2 and this achieves a very ultra-low noise.

The reduction in the ratio of the frequencies leads to a reduction in a phase noise of the final output signal $F_{outfinal}$. The comparison frequency is much lower, so that the number N by which the noise is multiplied inside the main PLL 1810 is much lower. In an example, the ratio of second fixed frequency divider=2 reduces the phase noise of the final output signal $F_{outfinal}$ by a factor of 20-40 dB compared to a single PLL design, to enable an improved modulation scheme with higher data transfer rate. For example, phase noise at 100 KHz Δf from the carrier with standard PLL synthesizers is approximately −106 dBc/Hz. With the proposed frequency synthesizer 1800, the phase noise at 100 KHz Δf from the carrier could be in the range of −130 dBc/Hz, causing a significant improvement of 24 dB.

As said, this significant improvement of 24 dB in the phase noise enables implementation of higher complicated modulation schemes. For example, instead of current 256 QAM, if phase noise can be reduced by a factor of more than 20 dB, then a modulation scheme of 4096 QAM may be allowed. In other words, in the same bandwidth, one can use modulation scheme with much higher data rate, thus increasing the efficiency of the channel.

Translated to practical aspects, the ultra-low phase noise frequency synthesizer 1700 can give 10% cost savings, 10% improved battery life on Wi-Fi system, and 20 to 50% higher Wi-Fi data rate potential, and has major market potential in Cellular phones and mobile applications, or any other wireless communication system, to be used by smartphone or other integrated circuit designers and manufacturers, module makers and vendors that have PA, LNA, Switch and other related technology.

To summarize, the drastic improvements achieved in reducing phase noise in the ultra-low phase noise frequency synthesizer 1800 is based on the following: a) use of Dual PLL approach to reduce the multiplication number N2, b) use of sampling PLL 1818 as the reference PLL, to make its noise contribution and reference PLL phase noise negligible, c) use of DDS 1802 to provide low noise, high frequency input to the main PLL 1810, and d) use of high frequency Digital Phase Frequency Detector 1804 in the main PLL 1810.

In this embodiment the ultra-low phase noise frequency synthesizer 1800 is implemented in form of a module. In another form of this embodiment, this design of the ultra-low phase noise frequency synthesizer 1800 can be implemented not only as a part of big module, but also as an independent, separate chip, which can become a part of the front end module of a transceiver. The synthesizer can be implemented in an advanced technology for example but not limited to, like SiGe or GaAs.

One other practical aspect the ultra-low phase noise frequency synthesizer 1800 is that they may be used to remove non-linearities due to digital pre-distortion mechanism. The ultra-low phase noise frequency synthesizer 1800 is used with high linearity mixer to down convert the transmit signal. The mechanism suggested as a solution does not intend to use the receive path and thus aims to remove all the nonlinearities created by the receive path itself. This occurs inside a front end module that houses the Power amplifier with a mechanism for signal sampling, the ultra-low phase noise frequency synthesizer 1800, a mixer, an A/D converter, an LNA for the receive path. This way the entire DPD data extraction happens within the same part and as the power amplifier itself and a minimum of other distortions is added to the transmit signal. The attached SOC may now be provided with digital data that includes the nonlinearities of the transmit signal and a much smaller, rather negligible part of nonlinearities with regard to the use of the receive path or any other down conversion.

Figure 19:
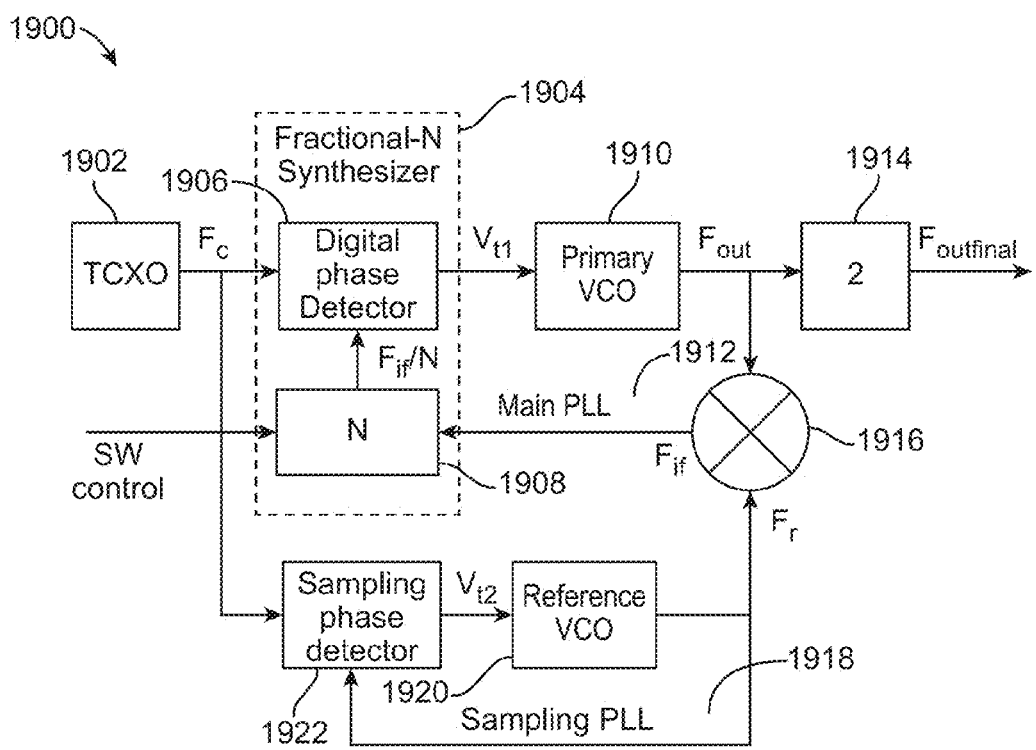
FIG. 19 illustrates a block diagram of an ultra-low phase noise frequency synthesizer as suggested in a second embodiment.

FIG. 19 illustrates a block diagram 1900 of an ultra-low phase noise frequency synthesizer as suggested in a second embodiment.

The low phase noise frequency synthesizer 1900 includes two Phase Lock Loops (PLLs). One is a main PLL 1912 and the other one is a sampling PLL 1918. In this embodiment, the ultra low phase noise frequency synthesizer 1900 comprises one single TCXO (Temperature Compensated Crystal Oscillator) 1902 which provides input clock signals to both the main PLL 1912 and the sampling reference PLL 1918.

The main PLL 1912 comprises of a Fractional-N synthesizer chip 1904, a primary Voltage Controlled Oscillator (VCO) 1910 and a down convert mixer 1916. The Fractional-N synthesizer chip 1904 includes a high frequency Digital Phase Detector 1906 and a software controllable variable frequency divider N 1908.

The TCXO 1902 forwards the generated at least one clock signal of fixed frequency $F_c$ towards the high frequency Digital Phase Detector 1906 which is located inside the Fractional-N synthesizer chip 1904. On one hand the high frequency Digital Phase Detector 1906 receives the at least one clock signal of fixed frequency $F_c$. On the other hand the high frequency Digital Phase Detector 1906 receives at least one signal of frequency $F_{if}/N$ generated by the software controllable variable frequency divider N 1908. The high frequency Digital Phase Detector 1906 compares these two signals, generates at least one first control voltage $V_{r1}$ and then forwards the generated at least one first control voltage $V_{r1}$ towards the primary VCO 1910. The primary VCO 1910 generates at least one output signal of frequency $F_{out}$ from the received at least one first control voltage $V_{r1}$.

The primary role of the sampling PLL 1918 is to help the main PLL 1912 to reduce the phase noise present in the at least one output signal $F_{out}$. The sampling PLL 1918 comprises a sampling phase detector 1922 and a reference Voltage Control Oscillator (VCO) 1920.

One important thing to notice here is the application of the sampling phase detector 1922. The sampling PLL 1918 does not use any kind digital devices like the Digital Phase Detector 1906, or the software controllable variable frequency divider N 1908. Due to these reasons the contribution of phase noise from the sampling PLL 1918 to the main PLL 1912 becomes close to negligible.

The sampling phase detector 1922 receives the same at least one clock signal of fixed frequency $F_c$ generated by the TCXO 1902, generates at least one second control voltage $V_{r2}$ and forwards it towards the reference VCO 1920. The reference VCO 1920 generates at least one reference signal Fr and forwards it towards the down convert mixer 1916.

The down convert mixer 1916 based on the received at least one reference signal of frequency $F_r$ and the at least one output signal of frequency $F_{out}$ generates at least one intermediate signal of frequency $F_{if}$ and forwards it towards the software controllable variable frequency divider N 1908 located inside the Fractional-N synthesizer chip 1904. The software controllable variable frequency divider N 1908 generates at least one signal of frequencies $F_{if}/N$ by dividing the incoming at least one intermediate signal of frequency $F_{if}$ by at least one variable value of N. The Fractional-N synthesizer chip 1904 varies the value of N by executing appropriate software instructions. The software controllable variable frequency divider N 1908 then forwards the generated at least one signal of frequency $F_{if}/IN$ towards the Digital Phase Detector 1906.

The primary VCO 1910 forwards the at least one output signal $F_{out}$ towards a first fixed frequency divider 1914 and generate at least one final output signal $F_{outfinal}$ by dividing the at least one output signal $F_{out}$ by a pre-defined factor.

To explain the second embodiment with an example let's say the TCXO 1902 generates the at least one clock signal of fixed frequency $F_c$ 100 MHz Both the main PLL 1912 and the sampling PLL 1918 are fed by the single TCXO 1902. The phase noise of the sampling PLL 1918 is generally very low due to the principle of sampling and also to the presence of the input clock TCXO 1902 which is itself a very low noise generating device.

The sampling phase detector 1922 generates the second control voltage $V_{r2}$ based on the at least one clock signal of fixed frequency $F_c$ 100 MHz and forwards the second control voltage $V_{r2}$ towards the reference VCO 1920. The reference VCO 1920 generates at least one reference signal Fr and forwards it towards the down convert mixer 1916. In an example, the reference VCO 1920 generates two reference signals of frequencies 11.75 GHz and 12.75 GHz.

In the example, the primary VCO 1910 generates the at least one output signal of a frequency $F_{out}$ ranging from 9.8 GHz to 11.7 GHz. The down convert mixer 1916 mixes the at least one output signal of frequency $F_{out}$ ranging from 9.8 GHz to 11.7 GHz with the two reference signal of frequencies 11.75 GHz and 12.75 GHz to generate the at least at least one intermediate signal of frequency $F_{if}$ ranging from 1.05 GHz to 2 GHz.

Based on the at least one clock signal of fixed frequency $F_c$, the Fractional-N synthesizer chip 1804 determines the value of the software controllable variable frequency divider N 1808, so as to generate at least one feedback signal of frequency $F_f = F_{if}/N$.

The frequency range 4.9 GHz-5.8 GHz is basically taken from a standard design in smart phones (Wi-Fi 5 GHz Band). It is easier and relatively inexpensive to implement the chip design of the low phase noise frequency synthesizer 1900 for higher output frequencies 9.8 GHZ to 11.7 GHz, and then divide the output frequencies by 2 to obtain the final output frequencies in the range of 4.9 GHz-5.8 GHz.

The down convert mixer 1916 lowers the frequency of the output signal $F_{out}$, to reduce a ratio of frequencies of the second clock signal and the feedback signal. Instead of feeding the output frequency $F_{out}$ directly to the Digital Phase Detector 1906, it is mixed down to create a much lower frequency, and thus a much lower value of N. A reduction in the ratio of the at least one clock signal of frequency $F_c$ and the at least one feedback signal of frequency $F_f$ leads to a reduction in a phase noise of the final output signal $F_{outfinal}$. The feedback frequency is lowered down, so that the number N by which the noise is multiplied inside the main PLL 1912 is also lowered down. If the output frequency $F_{out}$ is in the range of 11 GHz, and it has to be compared with a clock of 100 MHz, the ratio N of 11 GHz and 100 MHz is around 100, but if the output frequency $F_{out}$ is mixed down to 1 GHz by the down convert mixer 1916, then the ratio N of 1 GHz and 100 MHz may be only 10 instead of 100, thereby significantly reducing the phase noise of the low phase noise frequency synthesizer 1900.

The improvement in the phase noise of the low phase noise frequency synthesizer 1900 is based on following: a) use of dual PLL to reduce the multiplication number N, b) use of sampling PLL 1918 as the reference PLL to make its noise contribution negligible, c) use of high frequency low noise TCXO clock 1902 to provide high frequency input to the main PLL 1912, d) use of high frequency Fractional-N synthesizer 1914 in the primary PLL 1906.

In this second embodiment, the ultra-low phase noise frequency synthesizer 1900 is implemented in form of a module. In another form of this embodiment, this design of the ultra-low phase noise frequency synthesizer 1900 can be implemented not only as a part of big module, but also as an independent, separate chip, which can become a part of the front end module of a transceiver. The ultra-low phase noise frequency synthesizer 1900 can also be implemented in advanced technology for example like SiGe or GaAs.

Figure 20:
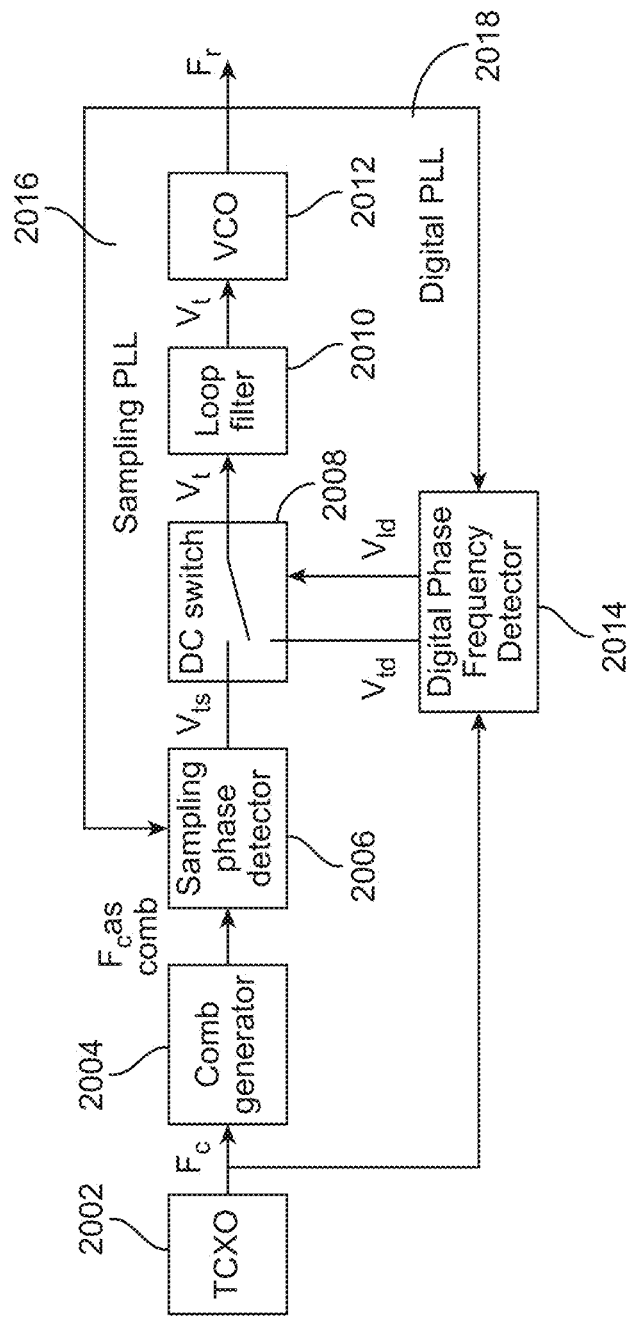
FIG. 20 illustrates a block diagram of the sampling PLL system as suggested in a third embodiment.

FIG. 20 illustrates a block diagram 2000 of the sampling Phase Lock Loop (PLL) system as suggested in a third embodiment.

The sampling PLL system 2000 includes a Temperature Compensated Crystal Oscillator (TCXO) 2002, a comb generator 2004, a sampling phase detector 2006, a two-way DC switch 2008, a loop filter 2010, a Voltage Controlled Oscillator (VCO) 2012, and a Digital Phase Frequency Detector 2014. The TCXO 2002 is configured to generate at least one clock signal of frequency $F_c$ z, which is applied to both of the comb generator 2004 and the Digital Phase Frequency Detector 2014. The sampling PLL system 2000 contains two PLL loops. One is a Sampling PLL loop 2016 and the other is a Digital PLL loop 2018.

The principle of operation in this embodiment is this: Initially the two-way DC switch 2008 remaining closed with the Digital Phase Frequency Detector 2014. Due to this only the Digital PLL loop 2018 is remains operational and the VCO 2012 gets locked to the at least one clock signal of frequency $F_c$ generated by the reference clock TCXO 2002. The Digital Phase Frequency Detector 2014 also generates at least one lock detect signal $V_{ld}$.

Once VCO 2012 gets locked to the at least one clock signal of frequency $F_c$ generated by the reference clock TCXO 2002, the at least one lock detect signal $V_{ld}$ generated by the Digital Phase Frequency Detector 2014 changes the two-way DC switch 2008 to the Sampling PLL loop 2016. Due to this the Sampling PLL loop 2016 gets closed and the Digital PLL loop 2018 gets opened. Since the VCO 2012 is already locked at the correct frequency, the Sampling PLL loop 2016 will remain closed. One important thing to notice here is that the loop filter 2010 is common to both the Sampling PLL loop 2016 and the Digital PLL loop 2018. As the loop filter 2010 is made up of a plurality of resistors and capacitors which are charged to the right tuning voltage $V_t$ which is applied to the VCO 2012. When the Sampling PLL loop 2016 gets closed and the Digital PLL loop 2018 gets opened, the plurality of resistors and capacitors present in the loop filter 2010 do not change their tuning voltages in that step. In other words, the Digital PLL loop 2018 is used to lock the VCO 2012 with the exact right frequency generated by the TCXO 2002 and the Sampling PLL loop 2016 is used to achieve low phase noise.

The two-way DC switch 2008 is configured to be switched between the sampling phase detector 2006 and the Digital Phase Frequency Detector 2014 based on a status of the lock detect signal $V_{ld}$ generated by the Digital Phase Frequency Detector 2014. For example, the two-way DC switch 2008 is configured to be connected to the Digital Phase Frequency Detector 2014 when the lock detect signal $V_{ld}$ is low, and configured to be connected to the sampling phase detector 2006 when the lock detect signal $V_{ld}$ is high.

In the third embodiment, when the lock detect signal $V_{ld}$ is low, the two-way DC switch 2008, the loop filter 2010, the VCO 2012 and the Digital Phase Frequency Detector 2014, forms a Digital PLL loop 2018. Whereas, when the lock detect signal $V_{ld}$ is high, the comb generator 2004, the sampling phase detector 2006, the two-way DC switch 2008, the loop filter 2010, and the VCO 2012 forms a sampling PLL loop 2016.

As said, initially, the two-way DC switch 2008 is connected to the Digital Phase Frequency Detector 2014, as the lock detect signal $V_{ld}$ is low due unlock state. In the Digital PLL loop 2018, the Digital Phase Frequency Detector 2014 generates a first DC output signal $V_{td}$ based on a comparison of the at least one clock signal of frequency Fc, and at least one output signal of frequency $F_r$, the loop filter 2010 filters the first DC output signal $V_{td}$ and generates the control voltage $V_t$, and the VCO 2012 generates the output signal frequency based on the control voltage $V_t$. In an example, the VCO 2012 is configured to generate either an output signal of frequency $F_r$ of 11.75 GHz or 12.75 GHz chosen by software control to the Digital PLL loop 2018.

As soon as the Digital PLL loop 2018 is locked at the output frequency $F_r$, the lock detect signal $V_{ld}$ turns high, the two-way DC switch 2008 disconnects from the Digital Phase Frequency Detector 2014 and connects to the sampling phase detector 2006, forming the sampling PLL loop 2016.

So once locked, the lock detector signal $V_{ld}$ from the Digital Phase Frequency Detector 2014 controls the two-way DC switch 2008 to switch to the sampling PLL 2016. The loop filter 2010 contains plurality of capacitors and resistors that are already charged to the correct tuning voltage $V_t$ of the VCO 2012, and since voltage on the plurality of capacitors and resistors cannot change in a "jump", there would not be any transient, and the VCO 2012 may continue receiving the same control voltage $V_{td}$. The sampling PLL system 2000 remains locked at the same frequency but now through the sampling phase mechanism.

In the Sampling PLL loop 2016, the comb generator 2004 receives the at least one clock signal of frequency $F_c$ and generates at least one comb signal $F_{comb}$. The at least one comb signal $F_{comb}$ is basically a plurality of narrow pulses, which are repeating at the same frequency $F_c$ which is the frequency of the at least one clock signal generated by the TCXO 2002. The sampling phase detector 2006 after receiving the at least one comb signal $F_{comb}$ generates a second DC output signal $V_{ts}$ based on the at least one comb signal $F_{comb}$. The loop filter 2010 generates the control voltage $V_t$ based on the second DC output signal $V_{ts}$ and the VCO 2012 remains locked at the output frequency $F_r$ based on the control voltage $V_t$.

At the execution of lock by the Digital Phase Frequency Detector 2014, the first DC output signal $V_{td}$ becomes equal to the second DC output signal $V_{ts}$. Further, the loop filter 2010 is common to the sampling PLL loop 2016 and the Digital PLL loop 2018 so as to maintain a similar control voltage $V_{ts}$ while switching from the Digital PLL loop 2018 to the sampling PLL loop 2016 and vice versa.

Another feature is that if by any chance, the sampling PLL loop 2010 loses a lock with the phase of the clock signal, the lock detect signal $V_{ld}$, which is still active, turns low to re-connect the two-way DC switch 2008 to the Digital Phase Frequency Detector 2014 to enable re-locking of the Digital PLL loop 2018 to the clock signal.

In this embodiment, the sampling PLL system 2000 is implemented in an independent chip form, with digital circuits replacing analog functions. The sampling PLL system 2000 may also be implemented as a block on a system on chip (SoC) or as a part of a module. The sampling PLL system 2000 may also be used in the ultra-low phase noise frequency synthesizers 1800 and 2000.

In this embodiment, the Digital PLL loop 2018 always locks at the correct frequency as the Digital PLL loop 2018 is software controlled to lock at a right frequency. The Digital Phase Frequency Detector 2014 is always able to lock from any distance regardless of how far away initially the VCO 2012 is from the reference clock $F_c$. Thus, use of the Digital PLL loop 2018 in the sampling PLL system 2000 overcomes the problem of the sampling PLL loop 2016 not being able to lock outside the lock range. The Digital PLL loop 2018 is used to lock the VCO 2012 on the right frequency and then switch to the sampling PLL loop 2016 to achieve the low noise. It also enables the system to operate with a wideband RF VCO 2012 with assurance that it will lock at the correct frequency. It eliminates the unreliable search mechanism and assures lock under all conditions and temperature conditions by providing true lock detect indication. The presence of Digital Phase Frequency Detector 2014 enables the use of wideband VCO 2012 in the sampling PLL loop 2016, as the Digital Phase Frequency Detector 2014 is able to lock the VCO 2012 at any desired frequency. The sampling PLL system 2000 offers a significant improvement over other products and is highly useful as one of the most important building blocks for ultra-low noise synthesizers.

In the sampling PLL loop 2016, there is no digital noise floor and the reference clock $F_c$ determines the overall phase noise, as this is the only factor that is translated to the output frequency by 20 log N.

Advantages of the sampling PLL system 2000: a) It enables the sampling PLL 2016 to operate with a wideband RF VCO with assurance that it will lock at the correct frequency, b) It eliminates the unreliable search mechanism and assures lock under all offset and temperature conditions, c) It provides true lock detect indication, d) Reliable improved operation and performance of the sampling PLL 2016, e) Ultra-low noise, f) Highly reliable, g) Having vastly improved performance, h) Easy to manufacture and use, i) Operational in a broadband RF range, and j) Implementable in a chip form.

Figure 21:
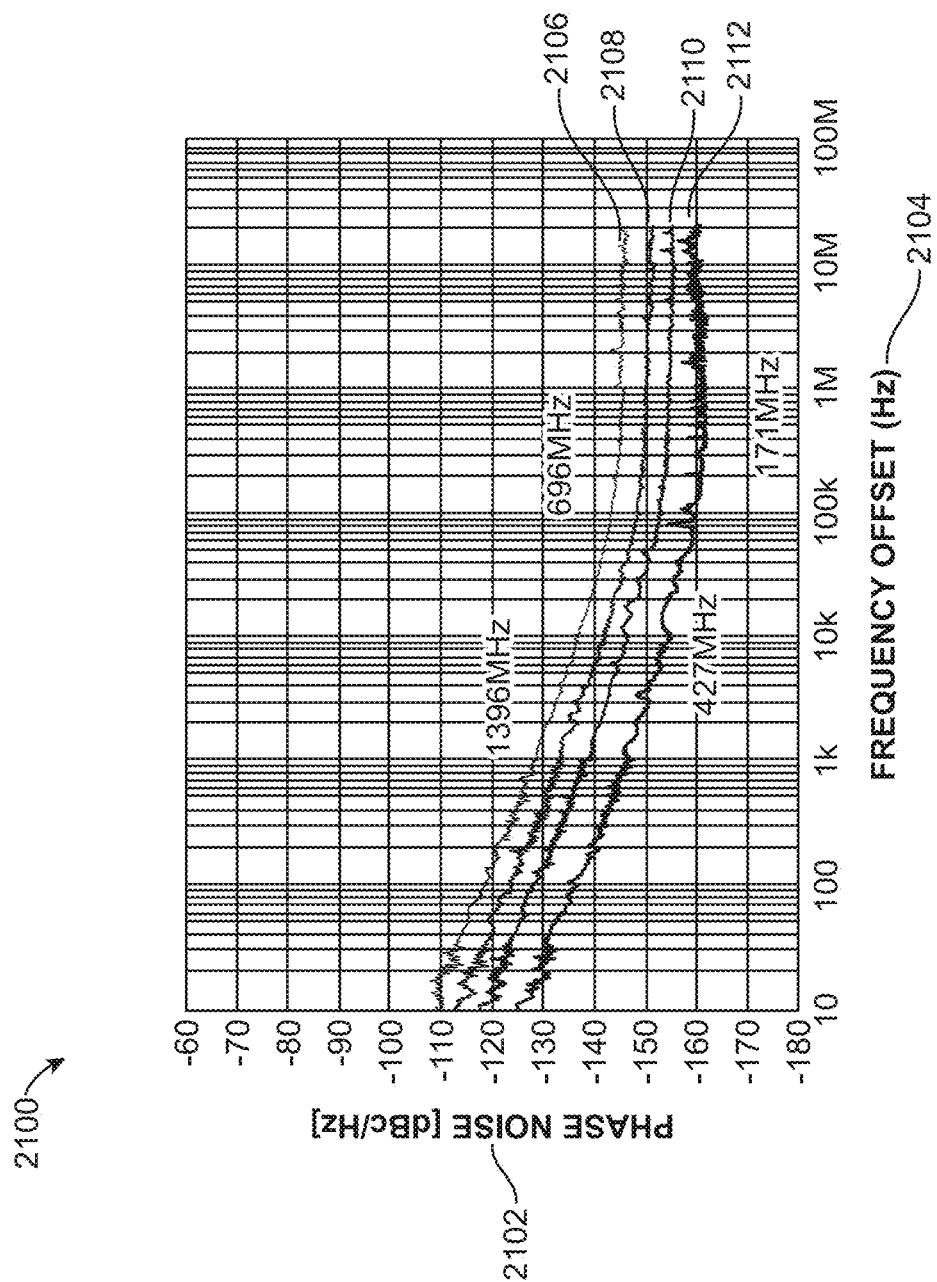
FIG. 21 illustrates a phase noise simulation plot contributed by a DDS chip in accordance with the first embodiment of the present disclosure.

FIG. 21 illustrates a phase noise simulation plot 2100 contributed by a DDS chip in accordance with the first embodiment of the present invention.

The two dimensional phase noise simulation plot 2100 comprises of an ordinate (vertical axis) disclosing Phase Noise (dBc/Hz) 2102 and one abscissa (horizontal axis) disclosing Frequency (Hz) 2104. The phase noise simulation plot 2100 discloses four phase noise plots corresponding to four input frequencies which are 1396 MHz 2106, 696 MHz 2108, 427 MHz 2110 and 171 MHz 2112 generated by the single DDS chip.

In the first embodiment of the present disclosure as disclosed above in FIG. 18, the DDS 1802 element generates at least one clock signal $F_{c2}$ of a variable frequency range of 0.525 GHz to 1 GHz. Correlating this variable frequency range of 0.525 GHz to 1 GHz applicable in the first embodiment of the present disclosure with the DDS phase noise simulation plot 2100, it becomes evidently clear that even in worst case scenario the DDS phase noise contribution in the first embodiment of the present disclosure stays in between the 1396 MHz 2106 and the 696 MHz 2108 which is in between −112 dBc/Hz and −110 dBc/Hz which is still very much negligible.

Figure 22:
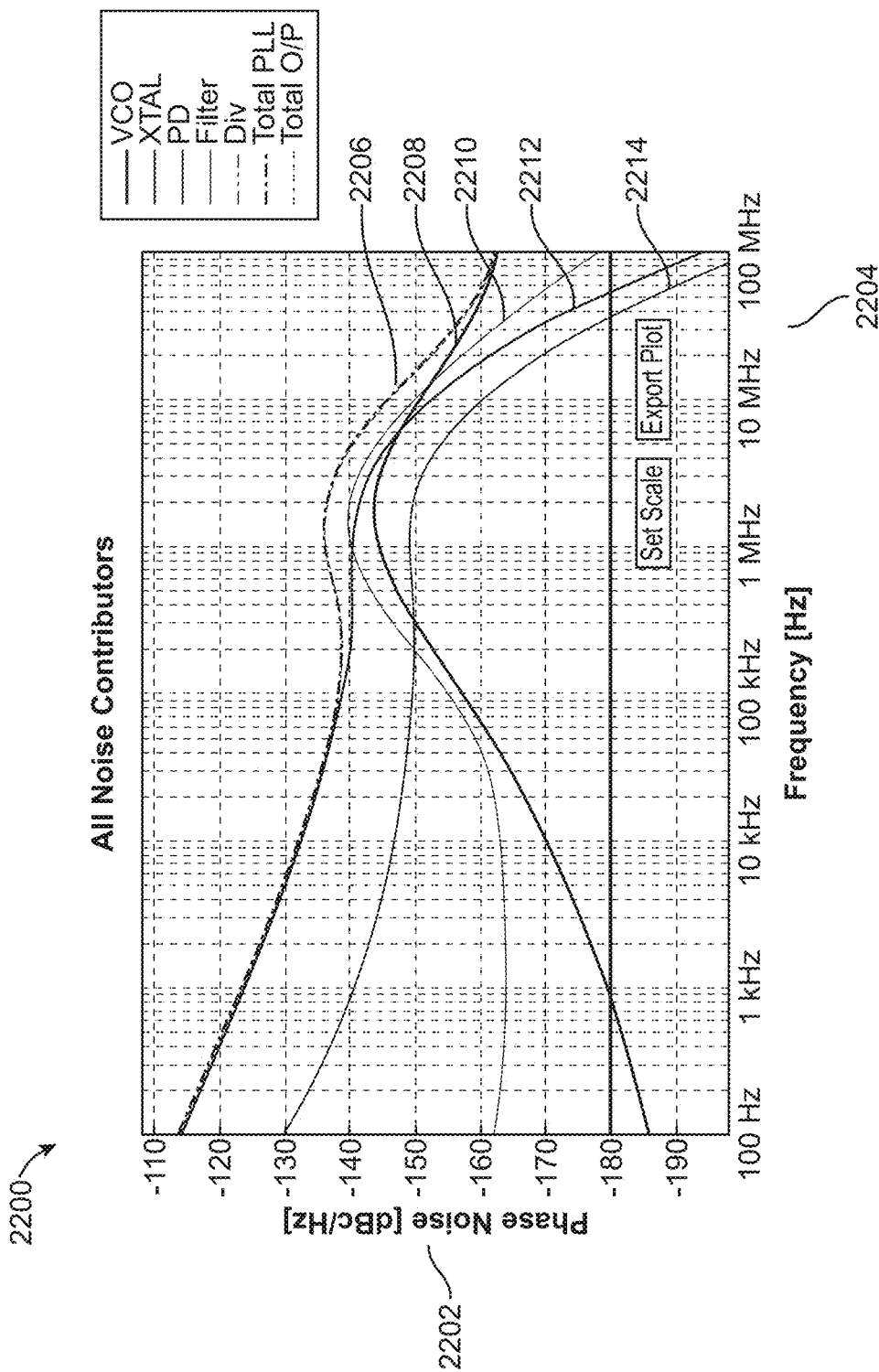
FIG. 22 illustrates a phase noise simulation plot contributed by a main PLL in accordance with the first embodiment of the present disclosure.

FIG. 22 illustrates a phase noise simulation plot 2200 contributed by the main PLL 1810 in accordance with the first embodiment of the present disclosure.

The two dimensional phase noise simulation plot 2200 comprises of an ordinate (vertical axis) disclosing Phase Noise (dBc/Hz) 2202 and one abscissa (horizontal axis) disclosing Frequency (Hz) 2204. The phase noise simulation plot 2200 discloses the phase noise contributed by the main PLL 1810 as disclosed in the first embodiment of the present disclosure in FIG. 18. It is evidently visible that the phase noise simulation plot 2200 has multiple contributors. The two most important contributors of phase noise in the phase noise simulation plot 2200 are the primary VCO 1806 and the DDS 1802 as discussed in FIG. 18.

A phase noise plot 2208 is the contribution of the primary VCO 1806 in the phase noise simulation plot 2200. As the primary VCO 1806 belongs to the main PLL 1810, the main PLL 1810 attenuates the phase noise 2208 coming from the primary VCO 1806 to quite an extent. This attenuation is clearly visible in the phase noise simulation plot 2200.

The other primary contributor in the phase noise simulation plot 2200 is the phase noise coming from the DDS 1802 present in the first embodiment of the present disclosure. A phase noise plot 2212 is the contribution of the DDS 1802 into the main PLL 1810. The phase noise plot 2212 is titled as XTAL in the phase noise simulation plot 2200. This phase noise plot 2212 is the contribution of the DDS 1802 in the main PLL 1810 at a worst point of an output frequency of 1000 MHz.

The main PLL 1810 forwards the primary VCO 1806 generated output frequencies of 9.8 GHz-11.7 GHz towards the down convert mixer 1816. The down convert mixer 1816 mixes incoming the primary VCO 1806 generated output frequencies of 9.8 GHz-11.7 GHz with the sampling reference frequencies of 11.75 GHz and 12.75 GHz and generates a attenuated intermediate frequencies of 1.05 GHz to 2 GHz. This attenuation procedure itself reduces the phase noise contributions coming from the primary VCO 1806 and the DDS 1802. It can be further note that a phase detector noise floor plot 2214 is negligible.

Figure 23:
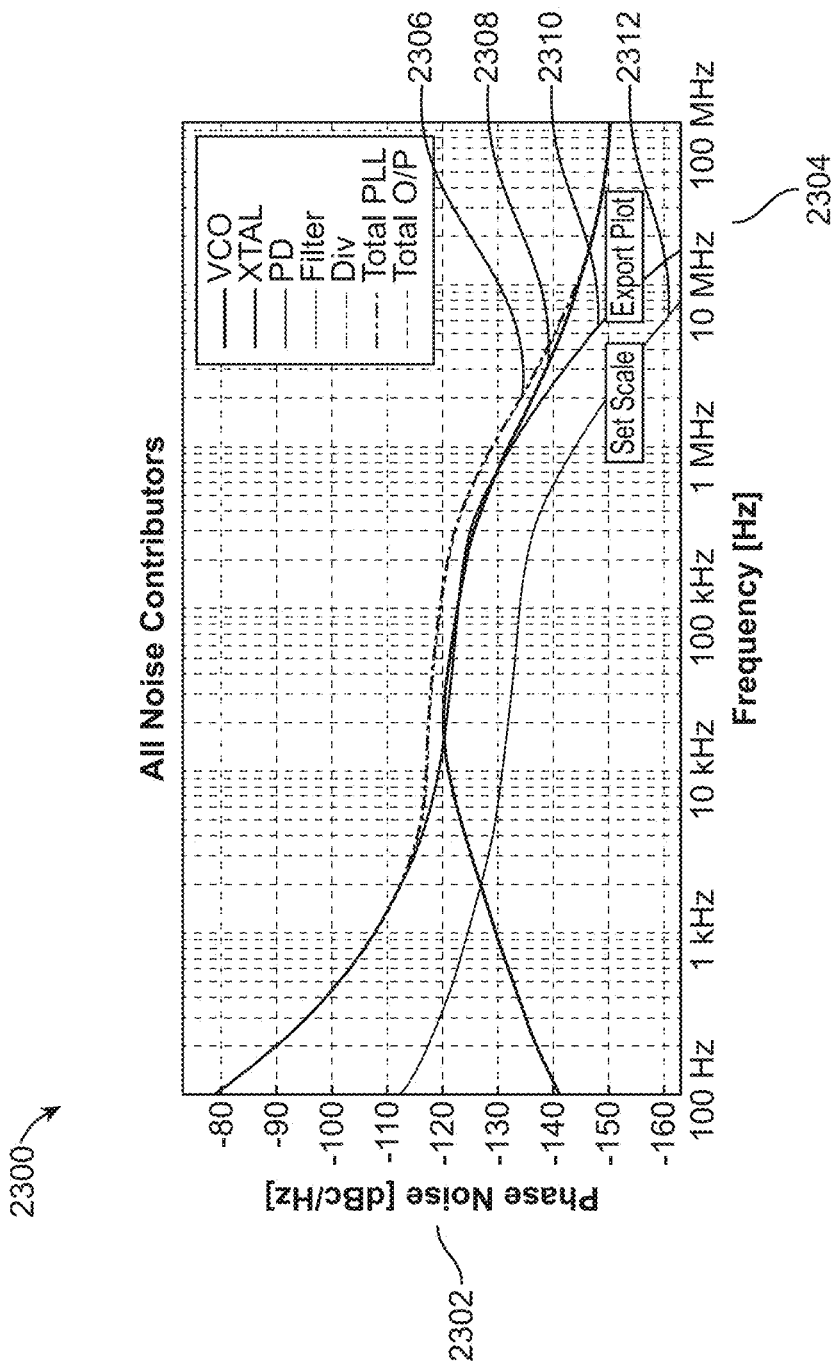
FIG. 23 illustrates a phase noise simulation plot contributed by a reference sampling PLL having the TCXO clock generating input frequencies of 100 MHz in accordance with the first embodiment of the present disclosure.

FIG. 23 illustrates a phase noise simulation plot 2300 contributed by a reference sampling PLL when a TCXO clock generates input frequencies of 100 MHz in accordance with the first embodiment of the present disclosure.

The two dimensional phase noise simulation plot 2300 comprises of an ordinate (vertical axis) disclosing Phase Noise (dBc/Hz) 2302 and one abscissa (horizontal axis) disclosing Frequency (Hz) 2304. The phase noise simulation plot 2300 discloses the phase noise contributed by the reference sampling PLL 1818 as disclosed in the first embodiment of the present disclosure in FIG. 18. It is evidently visible that the phase noise simulation plot 2300 has multiple contributors. The two most important contributors of phase noise in the phase noise simulation plot 2300 are the reference VCO 1820 and the TCXO 1824 as discussed in FIG. 18.

A phase noise plot 2308 is the contribution of the reference VCO 1820 in the phase noise simulation plot 2300. The reference sampling PLL 1818 attenuates the phase noise plot 2308 coming from the primary VCO 1806 to quite an extent. This attenuation is clearly visible in the phase noise simulation plot 2300.

The other primary contributor in the phase noise simulation plot 2300 is the phase noise coming from the TCXO 1824 present in the first embodiment of the present disclosure. A phase noise plot 2310 is the contribution of the TCXO 1824 into the reference sampling PLL 1818. The phase noise plot 2310 is titled as XTAL in the phase noise simulation plot 2300. This phase noise plot 2310 is the contribution of the TCXO 1824 in the reference sampling PLL 1818, when the TCXO 1824 is generating input frequencies of 100 MHz.

The reference sampling PLL 1818 forwards the generated sampling reference frequencies of 11.75 GHz and 12.75 GHz towards the down convert mixer 1816. The down convert mixer 1816 mixes this generated sampling reference frequencies of 11.75 GHz and 12.75 GHz with the incoming frequencies of 9.8 GHz-11.7 GHz to generate a attenuated intermediate frequencies of 1.05 GHz to 2 GHz. This attenuation procedure itself reduces the phase noise contributions coming from the reference VCO 1820 and the TCXO 1824.

Figure 24:
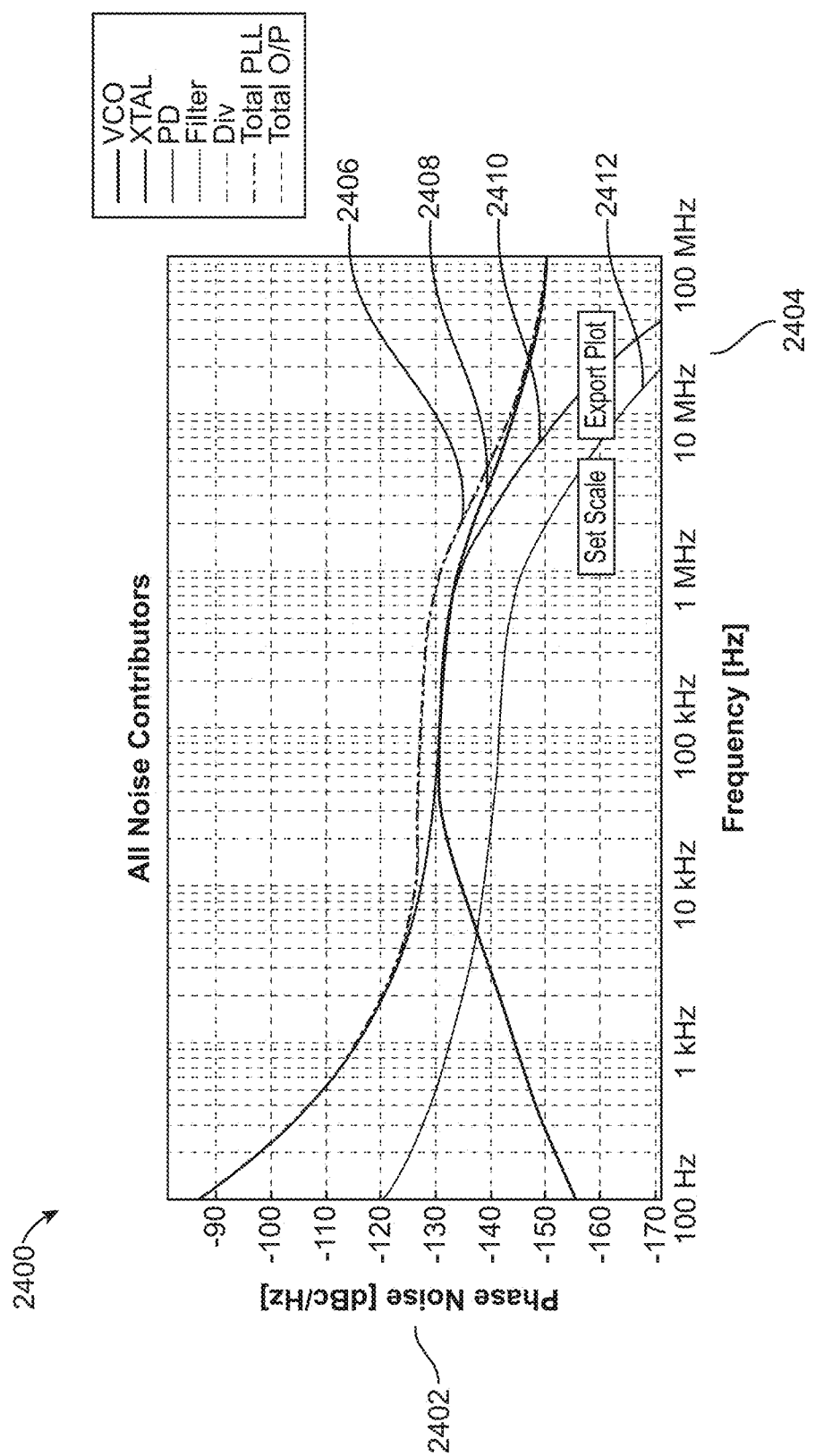
FIG. 24 illustrates a phase noise simulation plot contributed by a reference sampling PLL having the TCXO clock generating input frequencies of 250 MHz in accordance with the first embodiment of the present disclosure.

FIG. 24 illustrates a phase noise simulation plot 2400 contributed by a reference sampling PLL when a TCXO clock generates input frequencies of 250 MHz in accordance with the first embodiment of the present disclosure.

The two dimensional phase noise simulation plot 2400 comprises of an ordinate (vertical axis) disclosing Phase Noise (dBc/Hz) 2402 and one abscissa (horizontal axis) disclosing Frequency (Hz) 2404. The phase noise simulation plot 2400 discloses the phase noise contributed by the reference sampling PLL 1818 as disclosed in the first embodiment of the present disclosure in FIG. 18. It is evidently visible that the phase noise simulation plot 2400 has multiple contributors. The two most important contributors of phase noise in the phase noise simulation plot 2400 are the reference VCO 1820 and the TCXO 1824 as discussed in FIG. 18.

A phase noise plot 2408 is the contribution of the reference VCO 1820 in the phase noise simulation plot 2400. The reference sampling PLL 1818 attenuates the phase noise plot 2408 coming from the primary VCO 1806 to quite an extent. This attenuation is clearly visible in the phase noise simulation plot 2400.

The other primary contributor in the phase noise simulation plot 2400 is the phase noise coming from the TCXO 1824 present in the first embodiment of the present invention. A phase noise plot 2410 is the contribution of the TCXO 1824 into the reference sampling PLL 1818. The phase noise plot 2410 is titled as XTAL in the phase noise simulation plot 2400. This phase noise plot 2410 is the contribution of the TCXO 1824 in the reference sampling PLL 1818, when the TCXO 1824 is generating input frequencies of 250 MHz.

The reference sampling PLL 1818 forwards the generated sampling reference frequencies of 11.75 GHz and 12.75 GHz towards the down convert mixer 1816. The down convert mixer 1816 mixes this generated sampling reference frequencies of 11.75 GHz and 12.75 GHz with the incoming frequencies of 9.8 GHz-11.7 GHz to generate a attenuated intermediate frequencies of 1.05 GHz to 2 GHz. This attenuation procedure itself reduces the phase noise contributions coming from the reference VCO 1820 and the TCXO 1824.

Figure 25:
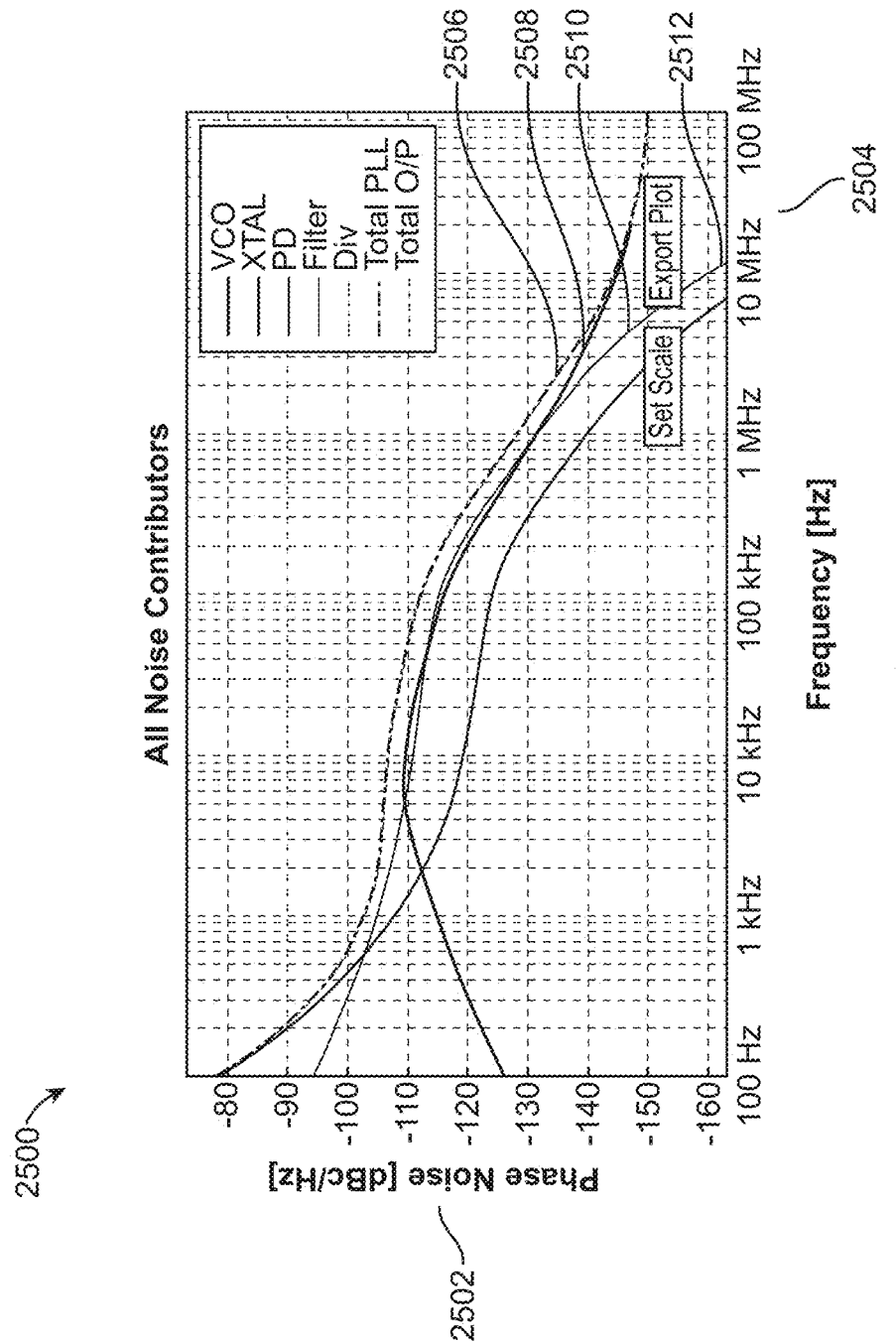
FIG. 25 illustrates a phase noise simulation plot contributed by a main PLL in accordance with the second embodiment of the present disclosure.

FIG. 25 illustrates a phase noise simulation plot 2500 contributed by a main PLL in accordance with the second embodiment of the present disclosure.

The two dimensional phase noise simulation plot 2500 comprises of an ordinate (vertical axis) disclosing Phase Noise (dBc/Hz) 2502 and one abscissa (horizontal axis) disclosing Frequency (Hz) 2504. The phase noise simulation plot 2500 discloses the phase noise contributed by the main PLL 1912 as disclosed in the second embodiment of the present disclosure in FIG. 19. The primary difference between the phase noise simulation plot 2500 and the above plots of FIGS. 22, 23 and 24 is that there is no DDS present in the second embodiment of the present disclosure. The most important contributor of phase noise in the phase noise simulation plot 2500 is the TCXO 1902 as discussed in FIG. 19.

A phase noise plot 2512 is the contribution of the TCXO 1902 into the main PLL 1910. The phase noise plot 2512 is titled as XTAL in the phase noise simulation plot 2500. Due to the absence of any DDS in the second embodiment of the present invention, a phase detector plot 2510 becomes a major factor.

The main PLL 1912 forwards the primary VCO 1910 generated output frequencies of 9.8 GHz-11.7 GHz towards the down convert mixer 1916. The down convert mixer 1916 mixes incoming the primary VCO 1910 generated output frequencies of 9.8 GHz-11.7 GHz with the sampling reference frequencies of 11.75 GHz and 12.75 GHz and generates attenuated intermediate frequencies of 1.05 GHz to 2 GHz. This attenuation procedure itself reduces the phase noise contributions coming from the TCXO 1902.

Figure 26:
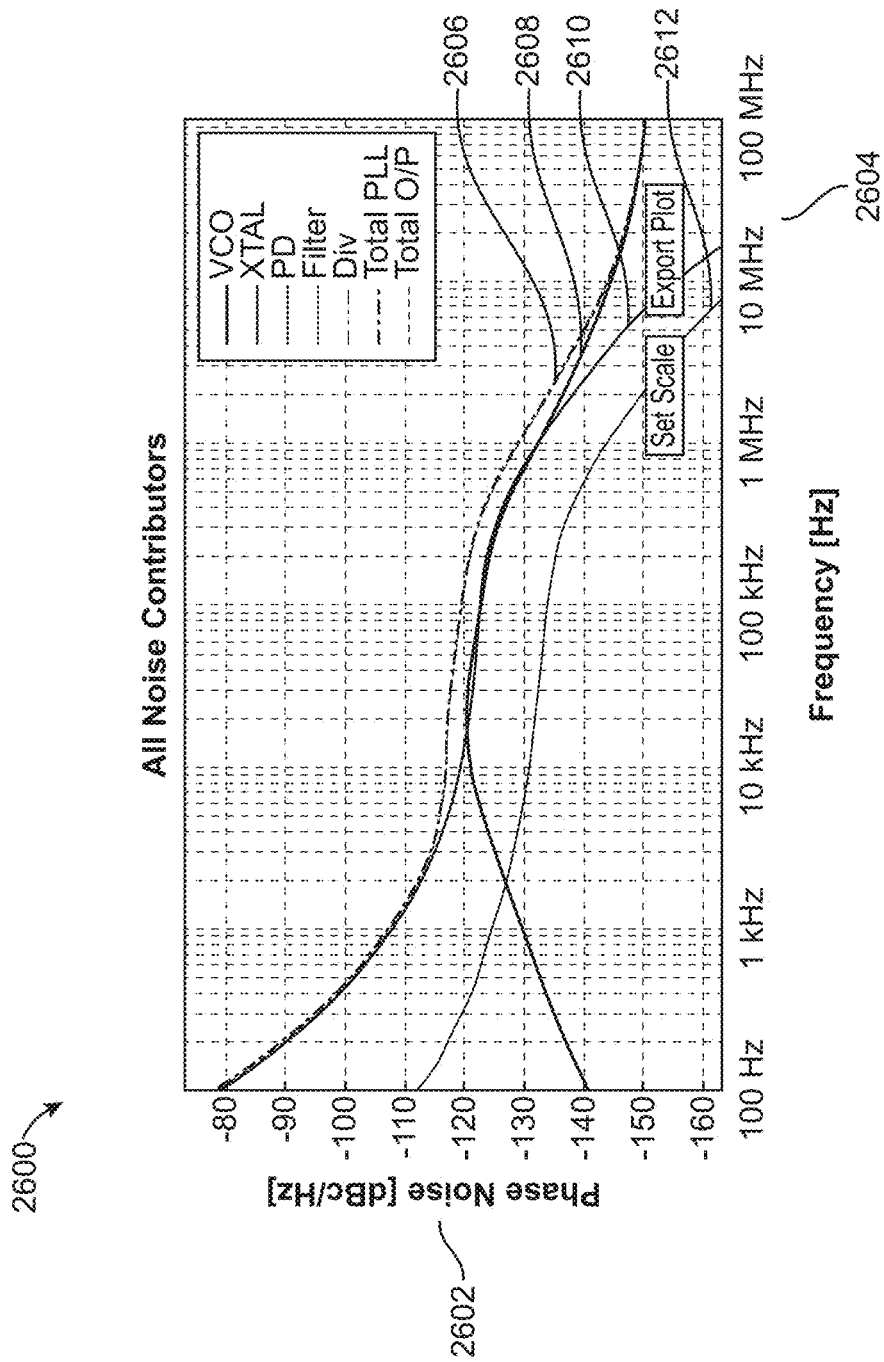
FIG. 26 illustrates a phase noise simulation plot contributed by a reference sampling PLL having the TCXO clock generating input frequencies of 100 MHz in accordance with the second embodiment of the present disclosure.

FIG. 26 illustrates a phase noise simulation plot 2600 contributed by a reference sampling PLL having the TCXO clock generating input frequencies of 100 MHz in accordance with the second embodiment of the present disclosure.

The two dimensional phase noise simulation plot 2600 comprises of an ordinate (vertical axis) disclosing Phase Noise (dBc/Hz) 2602 and one abscissa (horizontal axis) disclosing Frequency (Hz) 2604. The phase noise simulation plot 2600 discloses the phase noise contributed by the reference sampling PLL 1918 as disclosed in the second embodiment of the present disclosure in FIG. 19.

The primary contributor in the phase noise simulation plot 2600 is the phase noise coming from the TCXO 1902 present in the second embodiment of the present disclosure. A phase noise plot 2610 is the contribution of the TCXO 1902 into the reference sampling PLL 1918. The phase noise plot 2610 is titled as XTAL in the phase noise simulation plot 2600. This phase noise plot 2610 is the contribution of the TCXO 1902 in the reference sampling PLL 1918, when the TCXO 1902 is generating input frequencies of 100 MHz.

The reference sampling PLL 1918 forwards the generated sampling reference frequencies of 11.75 GHz and 12.75 GHz towards the down convert mixer 1816. The down convert mixer 1916 mixes this generated sampling reference frequencies of 11.75 GHz and 12.75 GHz with the incoming frequencies of 9.8 GHz-11.7 GHz to generate a attenuated intermediate frequencies of 1.05 GHz to 2 GHz.

Figure 27:
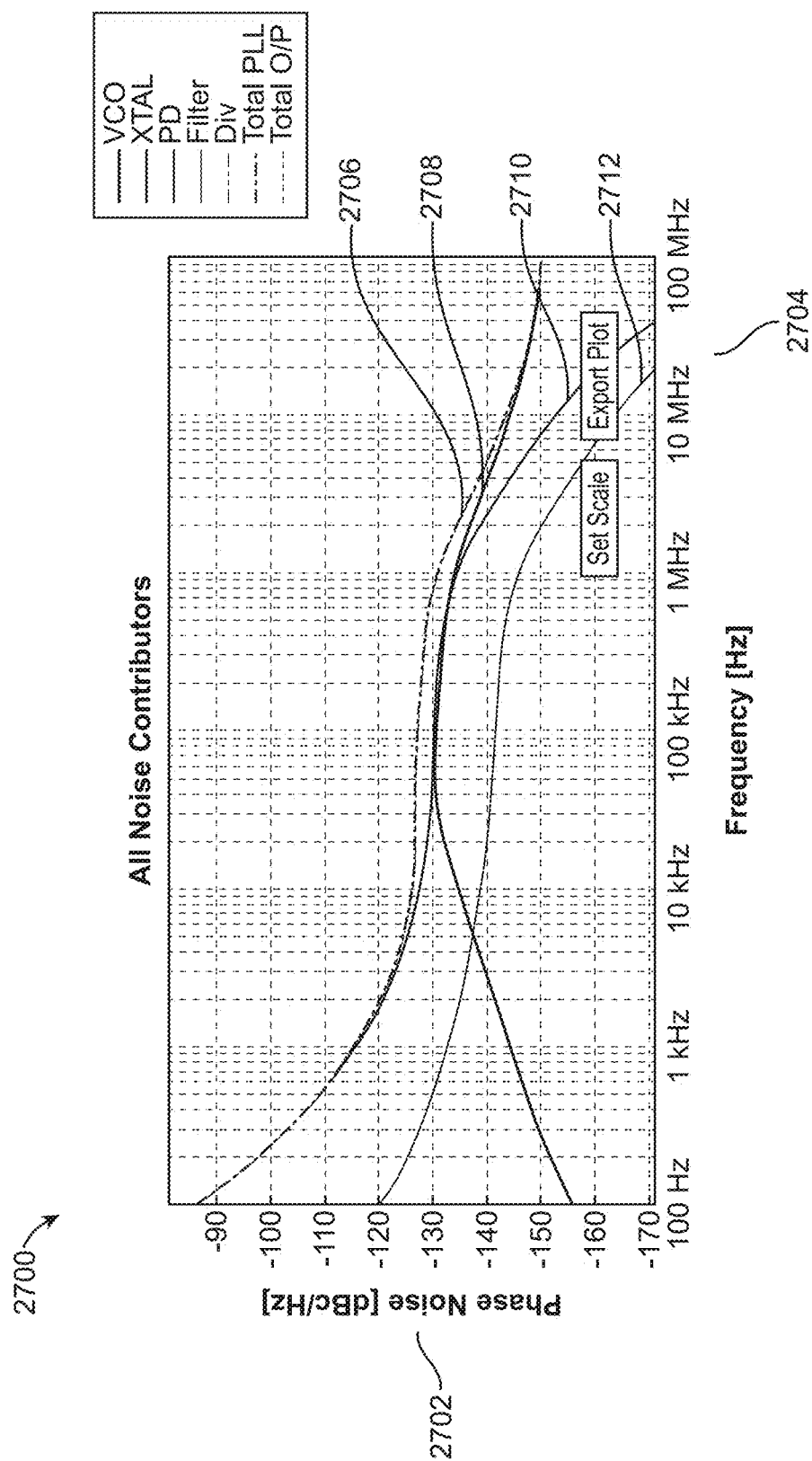
FIG. 27 illustrates a phase noise simulation plot contributed by a reference sampling PLL having the TCXO clock generating input frequencies of 250 MHz in accordance with the second embodiment of the present disclosure.

FIG. 27 illustrates a phase noise simulation plot 2700 contributed by a reference sampling PLL having the TCXO clock generating input frequencies of 250 MHz in accordance with the second embodiment of the present disclosure.

The two dimensional phase noise simulation plot 2700 comprises of an ordinate (vertical axis) disclosing Phase Noise (dBc/Hz) 2602 and one abscissa (horizontal axis) disclosing Frequency (Hz) 2604. The phase noise simulation plot 2700 discloses the phase noise contributed by the reference sampling PLL 1918 as disclosed in the second embodiment of the present disclosure in FIG. 19.

The primary contributor in the phase noise simulation plot 2700 is the phase noise coming from the TCXO 1902 present in the second embodiment of the present disclosure. A phase noise plot 2710 is the contribution of the TCXO 1902 into the reference sampling PLL 1918. The phase noise plot 2710 is titled as XTAL in the phase noise simulation plot 2700. This phase noise plot 2710 is the contribution of the TCXO 1902 in the reference sampling PLL 1918, when the TCXO 1902 is generating input frequencies of 250 MHz.

The reference sampling PLL 1918 forwards the generated sampling reference frequencies of 11.75 GHz and 12.75 GHz towards the down convert mixer 1816. The down convert mixer 1916 mixes this generated sampling reference frequencies of 11.75 GHz and 12.75 GHz with the incoming frequencies of 9.8 GHz-11.7 GHz to generate a attenuated intermediate frequencies of 1.05 GHz to 2 GHz.

Figure 28:
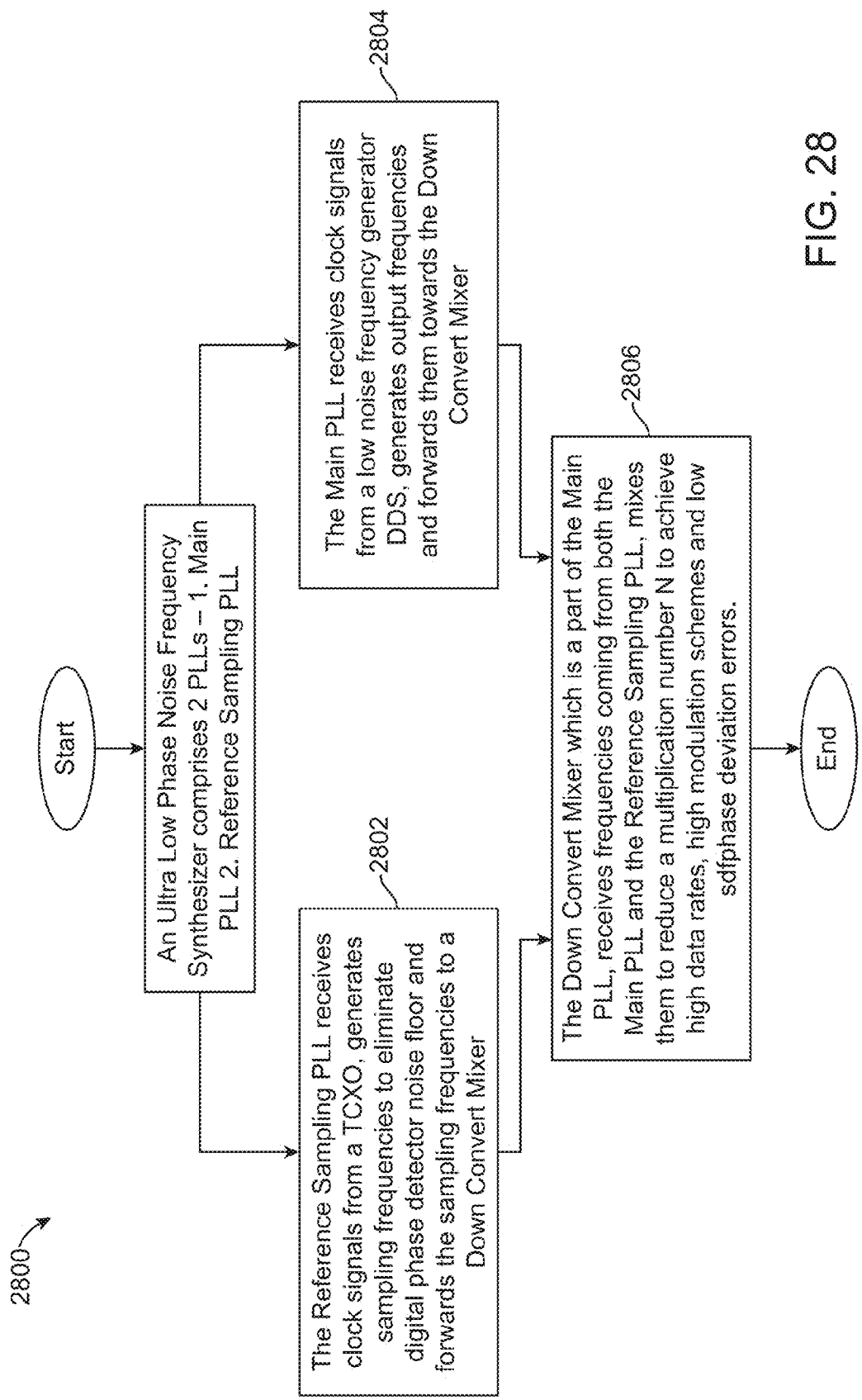
FIG. 28 illustrates a flow chart depicting the operational method steps of the first embodiment.

FIG. 28 illustrates a flow chart 2800 depicting the operational methods of the first embodiment in accordance with the present disclosure.

At step 2802, the Reference Sampling PLL receives clock signals from a TCXO, generates sampling frequencies to eliminate digital noise floor and forwards the sampling frequencies towards a Down Convert Mixer At step 2804, the Main PLL receives clock signals from a low noise frequency generator DDS, generates the output frequencies and forwards them towards the Down Convert Mixer.

At step 2806, the Down Convert Mixer which is a part of the Main PLL receives frequencies coming from both the Main PLL and the Reference Sampling PLL, mixes them to reduce a multiplication number N to achieve high data rate, high modulation schemes and low phase deviation errors.

Figure 29:
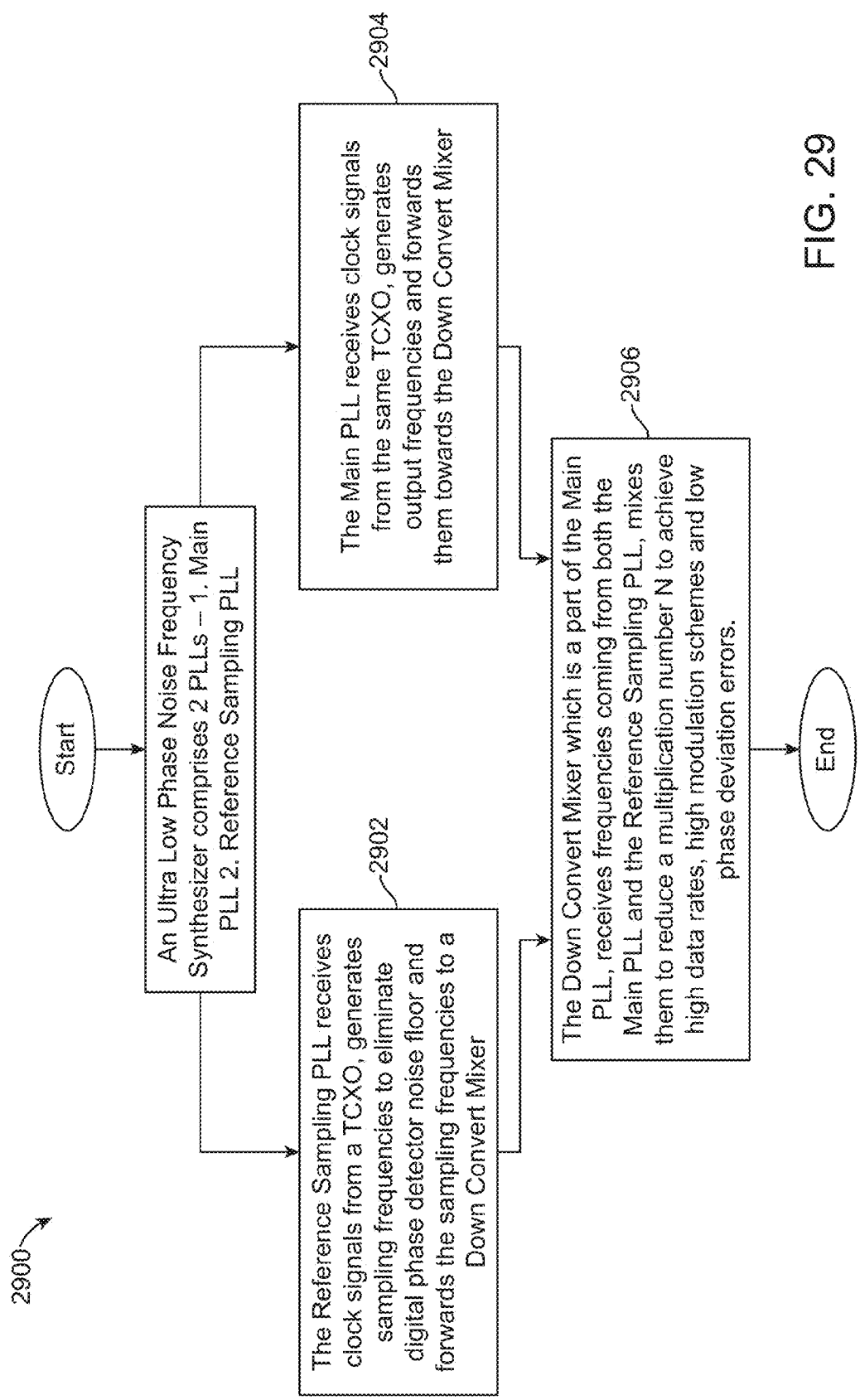
FIG. 29 illustrates a flow chart depicting the operational method steps of the second embodiment.

FIG. 29 illustrates a flow chart 2900 depicting the operational methods of the second embodiment in accordance with the present disclosure.

At step 2902, the Reference Sampling PLL receives clock signals from a TCXO, generates sampling frequencies to eliminate digital noise floor and forwards the sampling frequencies towards a Down Convert Mixer At step 2904, the Main PLL receives clock signals from the same TCXO, generates the output frequencies and forwards them towards the Down Convert Mixer.

At step 2906, the Down Convert Mixer which is a part of the Main PLL receives frequencies coming from both the Main PLL and the Reference Sampling PLL, mixes them to reduce a multiplication number N to achieve high data rate, high modulation schemes and low phase deviation errors.

Figure 30:
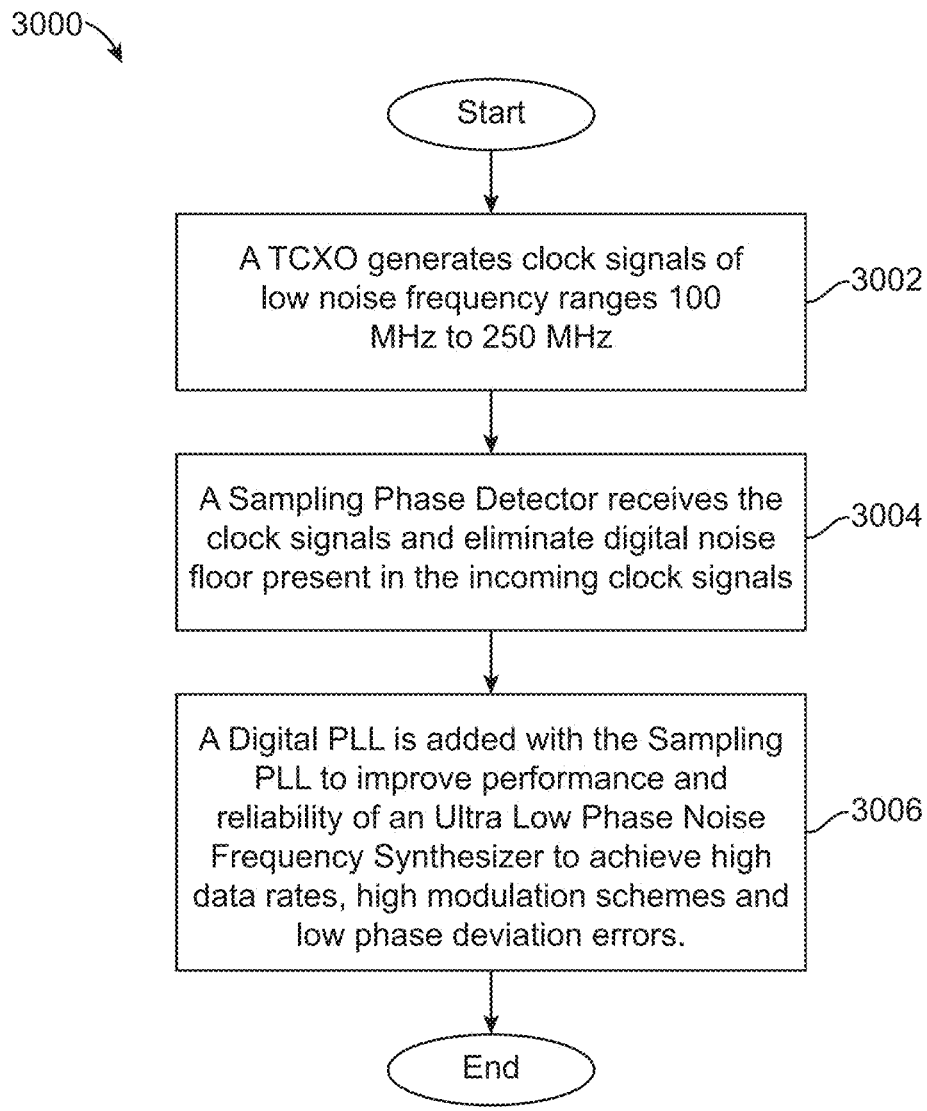
FIG. 30 illustrates a flow chart depicting the operational method steps of the third embodiment.

FIG. 30 illustrates a flow chart 3000 depicting the operational methods of the third embodiment in accordance with the present disclosure.

At step 3002, a TCXO generates clock signals of low noise frequency ranges from 100 MHz till 250 MHz.

At step 3004, a Sampling Phase Detector receives the clock signals and eliminates digital noise floor.

At step 3006, a Digital PLL is added with the Sampling PLL to improve performance and reliability of an Ultra Low Phase Noise Frequency Synthesizer to achieve high data rates, high modulation schemes and low phase deviation errors.

While the invention has been described in detail, modifications within the spirit and scope of the invention will be readily apparent to those of skill in the art. Such modifications are also to be considered as part of the present disclosure. In view of the foregoing discussion, relevant knowledge in the art and references or information discussed above in connection with the Background, which are all incorporated herein by reference, further description is deemed unnecessary. In addition, it should be understood that aspects of the invention and portions of various embodiments may be combined or interchanged either in whole or in part. Furthermore, those of ordinary skill in the art will appreciate that the foregoing description is by way of example only, and is not intended to limit the invention.

The foregoing discussion of the present disclosure has been presented for purposes of illustration and description. It is not intended to limit the present disclosure to the form or forms disclosed herein. In the foregoing Detailed Description, for example, various features of the present disclosure are grouped together in one or more embodiments, configurations, or aspects for the purpose of streamlining the disclosure. The features of the embodiments, configurations, or aspects may be combined in alternate embodiments, configurations, or aspects other than those discussed above. This method of disclosure is not to be interpreted as reflecting an intention the present disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate embodiment of the present disclosure.

Moreover, though the description of the present disclosure has included description of one or more embodiments, configurations, or aspects and certain variations and modifications, other variations, combinations, and modifications are within the scope of the present disclosure, e.g., as may be within the skill and knowledge of those in the art, after understanding the present disclosure. It is intended to obtain rights which include alternative embodiments, configurations, or aspects to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A system, comprising:
  a sampling Phase Locked Loop (PLL) system, wherein the sampling PLL system comprises:
    (i) a clocking device configured to generate a clock signal at a clock frequency;

(ii) a comb generator in communication with the clocking device, the comb generator converting the clock signal from a sine wave to a plurality of very narrow pulses at the clock frequency;

(iii) a sampling phase detector in communication with the comb generator, the sampling phase detector receiving the plurality of very narrow pulses at the at least one clock frequency and generating a first analog control voltage;

(iv) a Digital Phase/Frequency detector in communication with the clocking device, the Digital Phase/Frequency detector receiving the clock signal and generating a second analog control voltage; (v) a two-way DC switch in communication with the Digital Phase/Frequency detector and the sampling phase detector;

(vi) a loop filter in communication with the two-way DC switch; and (vii) a Voltage Controlled Oscillator (VCO) in communication with the at least one loop filter and configured to generate a single reference frequency, wherein:

(a) the Digital Phase/Frequency detector, the two-way DC switch, the loop filter, and the VCO operate as a digital Phase Locked Loop (PLL), (b) the comb generator, the sampling phase detector, the two-way DC switch, the loop filter, and the VCO operate as a sampling PLL, (c) the Digital Phase/Frequency detector (1) generates the second analog control voltage based on a comparison of the clock signal and the single reference frequency, and (2) generates a digital control voltage as a lock detect signal that is either high or low, the digital control voltage being high when the digital PLL is locked with the clock frequency and low when the digital PLL is not locked with the clock frequency, (d) the two-way DC switch receives the digital control voltage from the Digital Phase/Frequency detector and switches between the Digital Phase/Frequency detector and the sampling phase detector based on the digital control voltage, the two-way DC switch outputting: (1) the second analog control voltage from the Digital Phase/Frequency detector when the digital control voltage is low, and (2) outputting the first analog control voltage from the sampling phase detector when the digital control voltage is high, (e) the loop filter generates a third analog control voltage by receiving and filtering: (1) the second analog control voltage when the digital control voltage is low, and (2) the second first analog control voltage when the digital control voltage is high, and (f) the VCO generates the single reference frequency based on the third analog control voltage to lock either the digital PLL or the sampling PLL with the clock frequency.

2. The system of claim 1, wherein the clocking device comprises a Temperature Compensated Crystal Oscillator (TCXO).

3. The system of claim 2, wherein the clock frequency is between 10 MHz and 250 MHz, inclusive.

4. The system of claim 1, wherein the single reference frequency is one of 11.75 GHz and 12.75 GHz.

5. The system of claim 1, wherein the Digital Phase/Frequency detector executes an initial lock and, when the digital PLL locks the VCO to the clock frequency, the sampling PLL subsequently locks in with the clock frequency and the digital PLL unlocks.

6. The system of claim 5, wherein during the execution of the initial lock by the Digital Phase/Frequency detector, the first analog control voltage remains equal to the second analog control voltage.

7. The system of claim 1, wherein the digital control voltage controls the two-way DC switch by selecting the digital PLL, the sampling PLL, or a combination thereof.

8. The system of claim 1, wherein, when the sampling PLL loses a lock condition, the digital control voltage turns low to connect the two-way DC switch to the Digital Phase/Frequency detector to enable re-locking of the digital PLL with the clock signal.

9. The system of claim 1, wherein the loop filter is common to both the sampling PLL and the digital PLL such that a similar control voltage is maintained during switching from the digital PLL to the sampling PLL.

10. The system of claim 1, wherein the VCO is a Radio Frequency (RF) Broadband or narrowband device.

11. The system of claim 1, wherein the loop filter is a true integrator circuit.

12. The system of claim 1, wherein the sampling PLL is implemented in an independent chip form with digital circuits.

13. The system of claim 1, wherein the sampling PLL is implemented as a module, an integrated circuit, or a combination thereof.

* * * * *